United States Patent
Wakana et al.

(10) Patent No.: US 8,330,145 B2
(45) Date of Patent: Dec. 11, 2012

(54) SUPERCONDUCTING JUNCTION ELEMENT AND SUPERCONDUCTING JUNCTION CIRCUIT

(75) Inventors: Hironori Wakana, Tochigi (JP); Koji Tsubone, Tokyo (JP); Yoshinobu Tarutani, Tokyo (JP); Yoshihiro Ishimaru, Yokohama (JP); Keiichi Tanabe, Mito (JP)

(73) Assignees: The Chugoku Electric Power Co., Inc., Hiroshima (JP); Hitachi Ltd., Tokyo (JP); Fujitsu Limited, Kanagawa (JP); International Superconductivity Technology Center, The Juridical Foundation, Tokyo (JP)

( * ) Notice: Subject to any disclaimer, the term of this patent is extended or adjusted under 35 U.S.C. 154(b) by 0 days.

(21) Appl. No.: 12/549,537

(22) Filed: Aug. 28, 2009

(65) Prior Publication Data
US 2010/0006825 A1    Jan. 14, 2010

Related U.S. Application Data

(62) Division of application No. 11/584,050, filed on Oct. 20, 2006.

(30) Foreign Application Priority Data

Oct. 21, 2005   (JP) ................................ 2005-306499

(51) Int. Cl.
*H01L 27/18*   (2006.01)
(52) U.S. Cl. ................ 257/31; 257/32; 257/33; 257/34; 257/35; 257/36; 257/E39.001; 257/E39.003; 257/E39.005; 257/E39.012; 257/E39.014

(58) Field of Classification Search ............... 257/31–36, 257/E39.003, E39.012, E39.014, E39.001, 257/E30.005
See application file for complete search history.

(56) References Cited

U.S. PATENT DOCUMENTS

| 5,869,846 A * | 2/1999 | Higashino et al. ............... 257/31 |
| 2004/0077504 A1 * | 4/2004 | Adachi et al. ................. 505/234 |

FOREIGN PATENT DOCUMENTS

| JP | 2003-283324 A | 10/2003 |
| JP | 2004-15151 A | 1/2004 |
| JP | 2004-253645 A | 9/2004 |

OTHER PUBLICATIONS

H. Katsuno et al, "Characteristics of inteface-engineered Josephson junctions using a YbBa2Cu3Oy counterelectrode layer", Dec. 17, 2001, Applied Physics Letters, vol. 79, No. 25, pp. 4189-4191.*
Japanese Office Action for Japanese Patent Application No. 2005-306499.*

(Continued)

*Primary Examiner* — Ha Tran T Nguyen
*Assistant Examiner* — Suberr Chi
(74) *Attorney, Agent, or Firm* — Ladas & Parry LLP

(57) ABSTRACT

A superconducting junction element has a lower electrode formed by a superconductor layer, a barrier layer provided on a portion of a surface of the lower electrode, an upper electrode formed by a superconductor and covering the barrier layer, and a superconducting junction formed by the lower electrode, the barrier layer and the upper electrode. A critical current density of the superconducting junction is controlled based on an area of the lower electrode.

13 Claims, 28 Drawing Sheets

OTHER PUBLICATIONS

Hayakawa, "Ultrafast Digital Device Series 4: Ultrafast Josephson Device", 1986, Baihukan, pp. 44-48.*

Partial English Translation of Hayakawa, "Ultrafast Digital Device Series 4: Ultrafast Josephson Device", 1986, Baihukan, pp. 44-48.*

Saitoh, K. et al. "Voltage Divider Operation Using High-$T_c$ Superconducting Interface-Engineered Josephson Junctions" *Applied Physics Letters* (2000) vol. 76, No. 18, pp. 2606-2608.

Katsuno, H. et al. "A Novel Multilayer Process for HTS SFQ Circuit" *IEEE Transactions on Applied Superconductivity* (2003) vol. 13, No. 2, pp. 809-812.

Sonnenberg, A.H. et al. "Balanced Comparator Fabricated in Ramp Edge Technology" *Physica C* (1999) vol. 326-327, pp. 12-15.

Katsuno, H.,et al. "Characteristics of interface-engineered Josephson junctions using a$YbBa_2Cu_3O_y$ counterelectrode layer." *Applied Physics Letters* (2001) vol. 79, No. 25, pp. 4189-4191.

Office Action dated Aug. 16, 2011 in respect of Japanese Application No. 2005-306499.

Patent Abstracts of Japan English abstract of JP 2003-283324 A.

Patent Abstracts of Japan English abstract of JP 2004-15151 A.

Patent Abstracts of Japan English abstract of JP 2004-253645 A.

* cited by examiner

FIG.21

| EMBODIMENT | | COMPARISON EXAMPLE | |
|---|---|---|---|
| SUPER-CONDUCTING JUNCTION | CRITICAL CURRENT DENSITY (kA/cm$^2$) | SUPER-CONDUCTING JUNCTION | CRITICAL CURRENT DENSITY (kA/cm$^2$) |
| Ja1 | 108 | Jb1 | 76 |
| Ja2 | 108 | Jb2 | 52 |
| Ja3 | 115 | Jb3 | 48 |
| Ja4 | 115 | Jb4 | 48 |
| Ja5 | 123 | Jb5 | 56 |
| Ja6 | 124 | Jb6 | 94 |
| Ja7 | 130 | Jb7 | 54 |
| Ja8 | 110 | Jb8 | 45 |
| Ja9 | 135 | Jb9 | 47 |
| Ja10 | 125 | Jb10 | 46 |
| Ja11 | 134 | Jb11 | 44 |
| Ja12 | 128 | Jb12 | 45 |
| Ja13 | 132 | Jb13 | 44 |
| Ja14 | 131 | Jb14 | 58 |
| Ja15 | 105 | Jb15 | 83 |
| Ja16 | 110 | Jb16 | 68 |

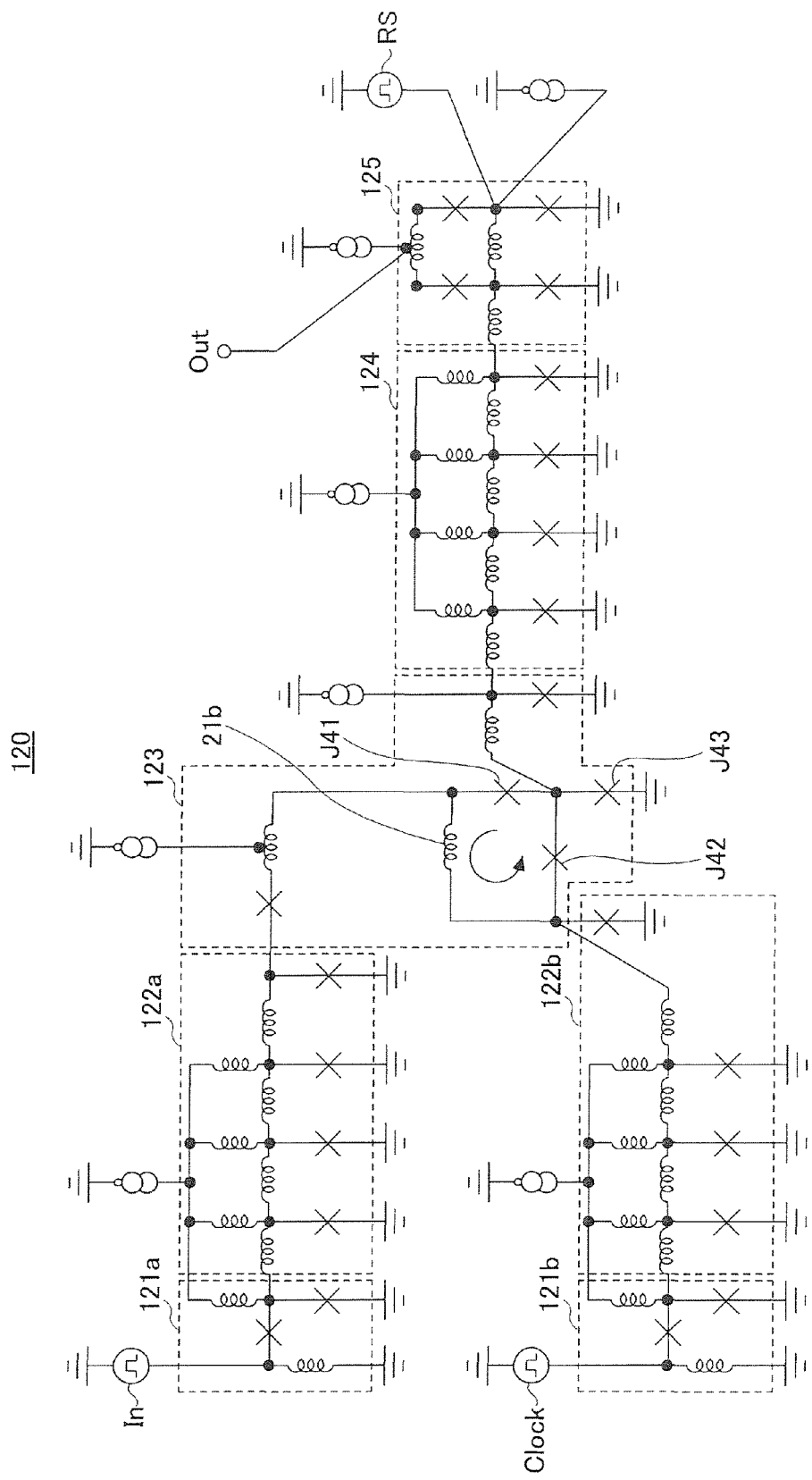

SUPERCONDUCTING JUNCTION ELEMENT AND SUPERCONDUCTING JUNCTION CIRCUIT

This is a divisional of copending application Ser. No. 11/584,050 filed on Oct. 20, 2006, claims the benefit thereof and incorporates the same by reference.

BACKGROUND OF THE INVENTION

1. Field of the Invention

The present invention generally relates to superconducting junction elements and superconducting junction circuits, and more particularly to a superconducting junction element and a superconducting junction circuit which can control a critical current density or a critical current.

2. Description of the Related Art

A critical temperature at which the phase changes from a normally conducting state to a superconducting state was 23K or less for a metal alloy. However, since the copper oxide superconductor $YBa_2Cu_3O_{7-x}$ (YBCO) having a critical temperature of 92K was found in 1987, active research has been made on oxide superconductors. In the case of the oxide superconductors, the critical temperature at which the phase changes from the normally conducting state to the superconducting state is higher than that of liquid nitrogen. In addition, the cooling cost of the oxide superconductors can be reduced considerably compared to liquid He because the oxide superconductors can use a cooler or liquid nitrogen as the cool medium. Furthermore, when a magnetic field is applied to the oxide superconductors, a decrease in the critical current is considerably small compared to that of the conventional metal superconductors.

It is expected that such oxide superconductors will be used in various fields. For example, a superconducting junction circuit having a superconducting junction element may be used in the field of superconductor electronics, as may be seen from Katsuno et al., "A Novel Multilayer Process for HTS SFQ Circuit", IEEE Transactions on Applied Superconductivity, Vol. 13, No. 2, pp. 809-812, June 2003. The superconducting junction element has two superconductors coupled via a superconducting junction part having weak superconductivity. For example, the flux quantum of the superconducting junction element, that is peculiar to the superconducting phenomenon, is controllable by an external voltage that is applied to the superconducting junction element. Hence, the superconducting junction circuit has high-speed response and low-noise characteristics due to the macroscopic quantum effect.

FIG. 1 is an equivalent circuit diagram of a conventional superconducting junction circuit. A description will be given of an operation of a superconducting junction circuit 200 shown in FIG. 1 that is formed by two superconducting junction elements 201a and 201b. The superconducting junction element 201a has a superconducting junction 202a, and the superconducting junction element 201b has a superconducting junction 202b. A D.C. current (or bias current) Ib from a D.C. current source 23 is supplied to the superconducting junction 202a via one of the superconductors thereof, and a D.C. current from another D.C. current source 23 is supplied to the superconducting junction 202b via one of the superconductors thereof. In addition when a current pulse caused by a flux quantum $ø_0$ is supplied to the input end, this current pulse is superimposed on the bias current Ib flowing through the superconducting junction 202a, and the current flowing through the superconducting junction 202a increases. In this state, the superconducting junction 202a switches from a "zero voltage state A" which is a superconducting state to a "finite voltage state B" as shown in FIG. 2 because the current flowing through the superconducting junction 202a exceeds a critical current Ic. FIG. 2 is a diagram for explaining the operation of the conventional superconducting junction circuit 200. In FIG. 2, the ordinate indicates the current I in arbitrary units, and the abscissa indicates the voltage V in arbitrary units. Furthermore, a current pulse caused by the flux quantum is supplied to the superconducting junction 202b due to the switching of the superconducting junction 202a to the "finite voltage state B", and the superconducting junction 202b similarly switches from the "zero voltage state A" to the "finite voltage state B". Accordingly, the flux quantum successively propagates through the superconducting junction elements 201a and 201b. Since the switching of the superconducting junctions 202a and 202b is based on the tunneling phenomenon, the switching time is 1 psec or less. Moreover, it is estimated that the power consumption of each of the superconducting junction elements 201a and 201b is several nW because the superconducting junction elements 201a and 201b operate at an extremely low current level, and it is expected that ultra high-speed switching elements having a low power consumption can be realized thereby.

FIG. 3 is a plan view showing the superconducting junction circuit corresponding to the equivalent circuit diagram shown in FIG. 1, and FIG. 4 is a cross sectional view taken along a line A-A in FIG. 3. In FIG. 3, the illustration of the D.C. current sources is omitted.

As shown in FIGS. 3 and 4, the superconducting junction element 201a of the superconducting junction circuit 200 has a lower electrode 206 provided on a substrate 205, a barrier layer 208 provided on an end surface of the lower electrode 206, an upper electrode 209 contacting the barrier layer 208, an insulator layer 210 insulating the upper and lower electrodes 209 and 206, and a protection layer 211 covering the upper electrode 209. The superconducting junction element 201b has a structure similar to that of the superconducting junction element 201a. The upper electrodes 209 of the two superconducting junction elements 201a and 201b are mutually connected, and the barrier layers 208 form the superconducting junctions 202a and 202b. The bias currents from the D.C. current sources 203 (not shown in FIGS. 3 and 4) flow to the lower electrodes 206 of the superconducting junction elements 201a and 201b via the upper electrodes 209 and the barrier layers 208. The two lower electrodes 206 are grounded.

It is known that the critical current of each of the superconducting junctions 202a and 202b of the superconducting junction circuit 200 is dependent on the junction area of the corresponding barrier layer 208. If the thickness of the lower electrode 206 and the inclination angle of the barrier layer 208 of the superconducting junction element 201a are approximately the same as the thickness of the lower electrode 206 and the inclination angle of the barrier layer 208 of the superconducting junction element 201b, the junction area of each of the barrier layers 208 depends on a width JWX of the corresponding upper electrode 209 shown in FIG. 3. Hence, by setting the widths of the upper electrodes 209 approximately the same, the critical currents of the superconducting junctions 202a and 202b will become approximately the same, and a stable operation of the superconducting junction circuit 200 will be obtained in this case.

However, in the case of the superconducting junction circuit 200 shown in FIGS. 3 and 4, the actual critical currents (corresponding to Ic in FIG. 2) of the superconducting junction elements 201a and 201b are inconsistent. For this reason, even if a current pulse caused by the flux quantum is supplied to the superconducting junction elements, the switching may not occur in some superconducting junction elements or, the current margin may be narrow in some superconducting junction elements even if the switching does occur. As a result, there is a problem in that a basic logic circuit or superconducting transmission line (or Josephson transmission line) that is formed by a small number of superconducting junction elements will not operate stably. In addition, this problem becomes more conspicuous and serious as the number of superconducting junction elements forming the basic logic circuit or superconducting transmission line increases.

SUMMARY OF THE INVENTION

Accordingly, it is a general object of the present invention to provide a novel and useful superconducting junction element and superconducting junction circuit, in which the problems described above are suppressed.

Another and more specific object of the present invention is to provide a superconducting junction element and a superconducting junction circuit, in which the critical current density or the critical current can be controlled with a high accuracy.

Still another object of the present invention is to provide a superconducting junction element comprising a lower electrode formed by a superconductor layer; a barrier layer provided on a portion of a surface of the lower electrode; an upper electrode formed by a superconductor and covering the barrier layer; and a superconducting junction formed by the lower electrode, the barrier layer and the upper electrode, wherein a critical current density of the superconducting junction is controlled based on an area of the lower electrode. According to the superconducting junction element of the present invention, it is possible to control the critical current density of the superconducting junction and accurately control the critical current of the superconducting junction.

A further object of the present invention is to provide a superconducting junction circuit which uses a signal of a flux quantum as a carrier, comprising a lower electrode formed by a superconductor layer; a barrier layer provided on a portion of a surface of the lower electrode; an upper electrode formed by a superconductor and covering the barrier layer; and a plurality of superconducting junctions each formed by a corresponding lower electrode and barrier layer and the upper electrode, wherein a critical current density of the superconducting junction is controlled based on an area of the lower electrode. According to the superconducting junction circuit of the present invention, it is possible to control the critical current density of the superconducting junction and accurately control the critical current of the superconducting junction. In addition, it is possible to set the critical current to a desired value that is required for the stable circuit operation.

Other objects and further features of the present invention will be apparent from the following detailed description when read in conjunction with the accompanying drawings.

BRIEF DESCRIPTION OF THE DRAWINGS

FIG. 21 is a diagram showing the critical current densities of the modification of the second embodiment and the comparison example;

FIG. 33 is an equivalent circuit diagram of the superconducting junction circuit shown in FIG. 32.

DESCRIPTION OF THE PREFERRED EMBODIMENTS

First Embodiment

Figure 5:
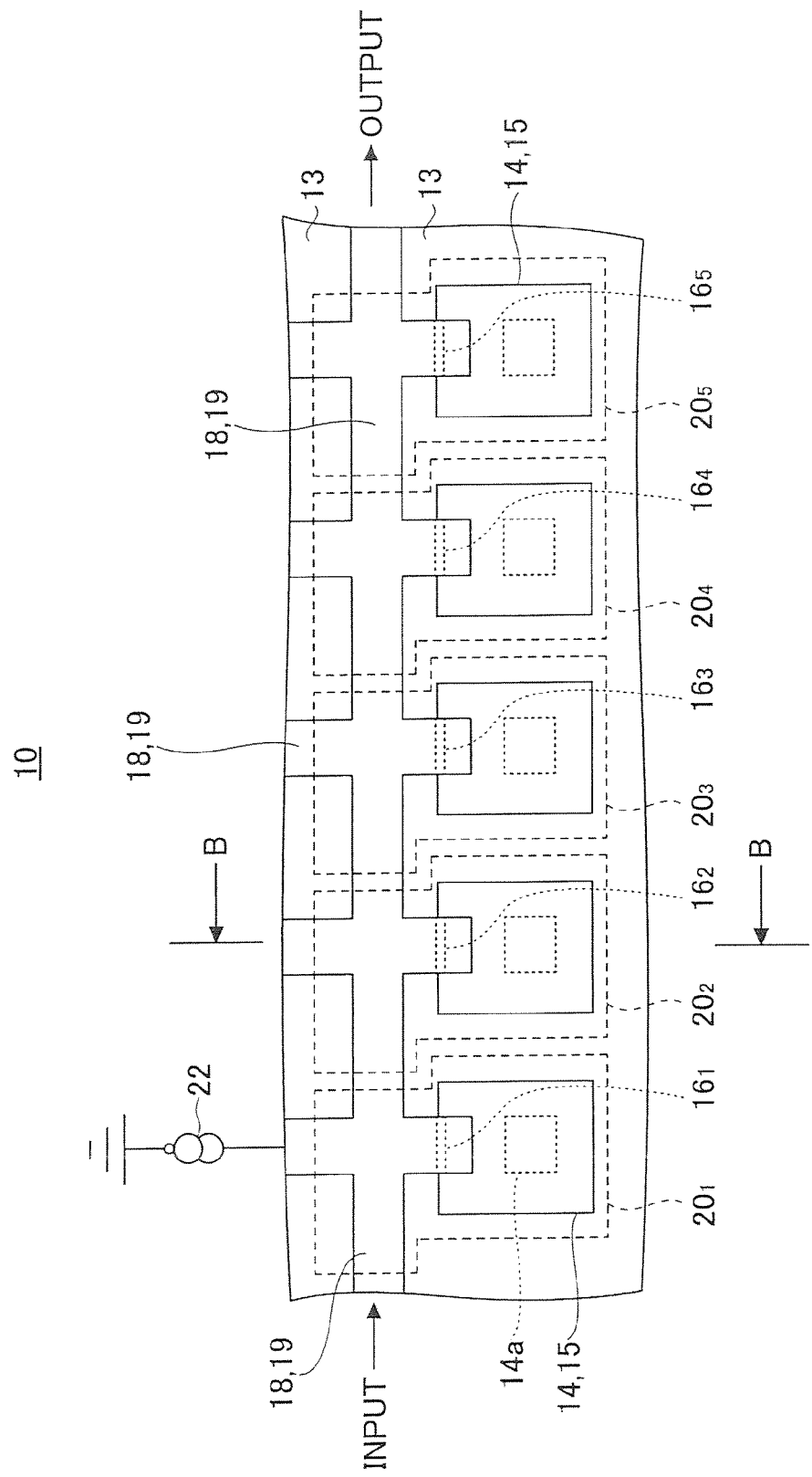
FIG. 5 is a plan view showing a first embodiment of a superconducting junction circuit according to the present invention.
Figure 6:
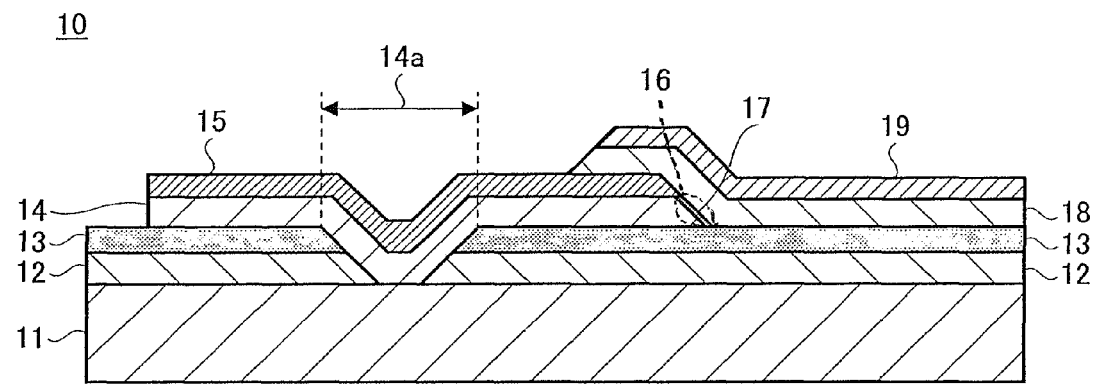
FIG. 6 is a cross sectional view taken along a line B-B in FIG. 5.
Figure 7:
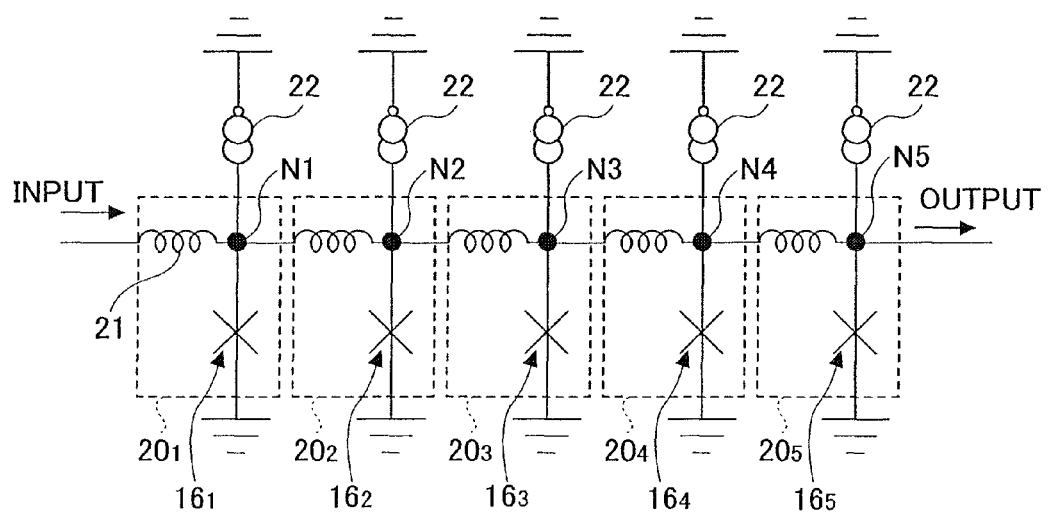
FIG. 7 is an equivalent circuit diagram of the first embodiment of the superconducting junction circuit.

FIG. 5 is a plan view showing a first embodiment of a superconducting junction circuit according to the present invention, and FIG. 6 is a cross sectional view taken along a line B-B in FIG. 5. FIG. 7 is an equivalent circuit diagram of the first embodiment of the superconducting junction circuit.

A superconducting junction circuit 10 of this first embodiment shown in FIGS. 5 through 7 is formed by a superconducting line connecting five superconducting junction elements $20_1$ through $20_5$. As shown in FIG. 7, the superconducting junction elements $20_1$ through $20_5$ of the superconducting junction circuit 10 are connected so that inductances 21 thereof are connected in series, and so that a D.C. current source 22 and a superconducting junction $16_i$ are connected to a node Ni, where i=1, 2, ..., 5. The node N1 connects the inductors 21 of the adjacent superconducting junctions $16_1$ and $16_2$, the node N2 connects the inductors 21 of the adjacent superconducting junctions $16_2$ and $16_3$, the node N3 connects the inductors 21 of the adjacent superconducting junctions $16_3$ and $16_4$, and the node N4 connects the inductors 21 of the adjacent superconducting junctions $16_4$ and $16_5$. The node N5 connects the current source 22, and the inductor 21 and the superconducting junction $16_5$ of the superconducting junction element $20_5$.

The superconducting junction circuit 10 (superconducting junction elements $20_1$ through $20_5$) has a substrate 11, a superconducting magnetic shielding layer 12 provided on the substrate 11, a first interlayer insulator 13, a lower electrode 14, a second interlayer insulator 15 covering the lower electrode 14, a barrier layer 17 provided on an end surface of the lower electrode 14, an upper electrode 18, and a protection layer 19 covering the upper electrode 18. The upper electrode 18 contacts the barrier layer 17, and covers portions of the first and second interlayer insulators 13 and 15.

For example, the substrate 11 is made of MgO, yttrium stabilized zirconia (YSZ), $SrTiO_3$, $(LaAlO_3)_{0.3}$—$(SrAl_{0.5}Ta_{0.5}O_3)_{0.7}$(LSAT), $LaAlO_3$ or the like.

The superconducting magnetic shielding layer 12, the lower electrode 14 and the upper electrode 18 may be made of any suitable superconductor material. For example, the superconducting magnetic shielding layer 12, the lower electrode 14 and the upper electrode 18 may be made of a single element such as Nb and Pb, an alloy superconductor material, compound superconductor material such as $Nb_3Sn$ and $V_3Si$, oxide superconductor material or the like. Of such superconductor materials, it is preferable to use the oxide superconductor material because of its high superconducting critical temperature and low cooling cost. For example, the oxide superconductor material includes YBCO ($YBa_2Cu_3O_{7-x}$), materials having a portion of the yttrium or the entire yttrium within the YBCO replaced by one or more kinds of rare earth metal elements, mercury superconductor materials such as Hg-M-Cu—O (where an element M is at least one of elements selected from Ba, Sr and Ca), and bismuth superconductor materials such as $Bi_2Sr_2Ca_2Cu_3O_{10}$.

The superconducting junction 16 that is formed by the lower electrode 14, the barrier layer 17 and the upper electrode 18 is the so-called Josephson junction. In the present invention, the Josephson junction may have the structure of any type selected from the stacked type, the grain boundary type, the step edge type and the ramp edge type, but in this first embodiment, a description will be given of a case where the Josephson junction is the ramp edge type.

The barrier layer 17 may be formed by an insulator layer that is grown on the surface of the lower electrode 14. Alternatively, instead of providing an insulator layer, the barrier layer 17 may be formed by irradiating an ion beam, such as an Ar ion beam, on a portion of the surface of the lower electrode 14 so as to modify this portion and form a damaged layer amounting to several atomic layers.

For example, the first and second interlayer insulators 13 and 15 is made of $CeO_2$, $SrTiO_3$, $(LaAlO_3)_{0.3}$—$(SrAl_{0.5}Ta_{0.5}O_3)_{0.7}$(LSAT) $(SrAl_{0.5}Ta_{0.5}O_3)_{0.7}$(SAT) or the like.

In addition, each of the layers 12 through 15 and 18 forming the superconducting junction circuit 10 may be formed by sputtering, laser ablation, evaporation, chemical vapor deposition (CVD) or the like. Furthermore, the patterning of the lower electrode 14 and the upper electrode 18 and the forming of the inclined surface (or sloping surface) of the lower electrode 14 may be formed by known dry etching techniques such as ion milling.

As shown in FIG. 5, each upper electrode 18 has a predetermined junction width and forms the superconducting junction 16 between the lower electrode 14 via the barrier layer 17. The upper electrodes 18 connect the superconducting junction elements $20_1$ through $20_5$, and form the inductors 21. Bias currents are supplied from D.C. current sources 22 to the superconducting junctions $16_1$ through $16_5$ via the upper electrodes 18. Although one D.C. current source 22 is connected to each of the superconducting junction elements $20_1$ through $20_5$ as shown in FIG. 7, only one D.C. current source 22 is shown in FIG. 5 for the sake of convenience.

The lower electrode 14 contacts the superconducting magnetic shielding layer 12 via a contact hole 14a in the first interlayer insulator 13, and is grounded via the superconducting magnetic shielding layer 12 which acts as a grounding layer. This contact hole 14a is formed in a portion of the first interlayer insulator 13 and penetrates the first interlayer insulator 13 in a direction taken along the thickness of the first interlayer insulator 13. That is, at an interface between the lower electrode 14 and the first interlayer insulator 13, the contact hole 14a is formed on an inner side (that is, left side in FIG. 6) of a boundary where the lower electrode 14 starts to slope in the direction taken along the thickness of the first interlayer insulator 13 from the flat state, as shown in FIG. 6. In the case of a Josephson junction other than the ramp edge type, the contact hole may be an opening that is formed for a wiring electrically connecting the lower electrode 14 and the superconducting magnetic shielding layer 12 on the first interlayer insulator 13. In the following description, the area of the contact hole refers to the area of the contact hole that is observed in the plan view.

One lower electrode 14 is provided with respect to each of the superconducting junction elements $20_1$ through $20_5$. The critical current density of each of the superconducting junctions $16_1$ through $16_5$ is controlled based on the area of the corresponding lower electrode 14. The critical current density of each of the superconducting junctions $16_1$ through $16_5$ has a negative correlation with respect to the area of the corresponding lower electrode 14. Accordingly, by setting the areas of the lower electrodes 14 of the superconducting junctions $16_1$ through $16_5$ approximately the same in the superconducting junction circuit 10, it is possible to make the critical current densities of the superconducting junctions $16_1$ through $16_5$ approximately the same. The area of the lower electrode 14 also refers to the area of the lower electrode 14 that is observed in the plan view, that is, the area of the lower electrode 14 that is observed in the plan view of the superconducting junction circuit 10 shown in FIG. 5.

Although not shown in FIG. 5, two or more superconducting junctions may be formed with respect to one lower electrode 14. Even when two or more superconducting junctions are formed with respect to one lower electrode 14, the critical current density of each of the superconducting junctions $16_1$ through $16_5$ becomes approximately the same as the case where one superconducting junction is formed with respect to one lower electrode 14.

In addition, each of the superconducting junctions $16_1$ through $16_5$ controls the critical current based on the junction area thereof. In the case of the ramp edge type Josephson junction, the junction area is a product of the width (junction width) of the lower electrode 14, the thickness of the lower electrode 14, and $1/\sin \theta$, where $\theta$ is the angle formed by the end surface of the lower electrode 14 on which the barrier layer 17 is formed and the top surface (substrate surface) of the substrate 11. It is possible to control the critical current of each of the superconducting junctions $16_1$ through $16_5$ based on the width (junction width) of the lower electrode 14, by setting each of the width (junction width) of the lower electrode 14, the thickness of the lower electrode 14, and the angle formed by the end surface of the lower electrode 14 on which the barrier layer 17 is formed and the substrate surface approximately the same for each of the superconducting junctions $16_1$ through $16_5$. In other words, it is possible to control the critical current of each of the superconducting junctions $16_1$ through $16_5$ based on the area of the corresponding lower electrode 14 and the width (junction width) of the corresponding lower electrode 14. For example, the critical currents of the superconducting junctions $16_1$ through $16_5$ can be made approximately the same by setting each of the area of the lower electrode 14, the thickness of the lower electrode 14, the angle formed by the end surface of the lower electrode 14 on which the barrier layer 17 is formed and the substrate surface, and the width (junction width) of the lower electrode 14 approximately the same for each of the superconducting junctions $16_1$ through $16_5$.

Figure 1:
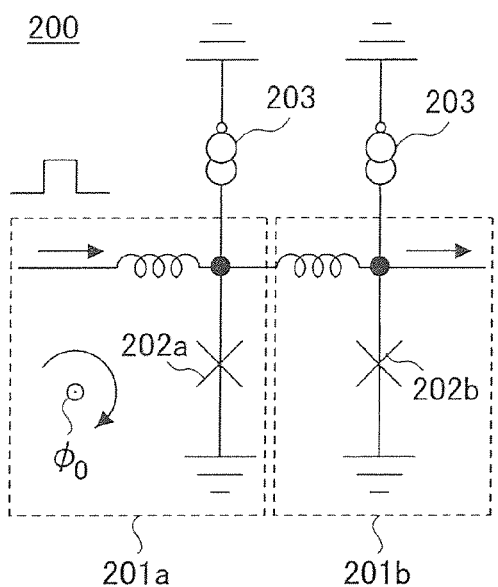
FIG. 1 is an equivalent circuit diagram of a conventional superconducting junction circuit.
Figure 2:
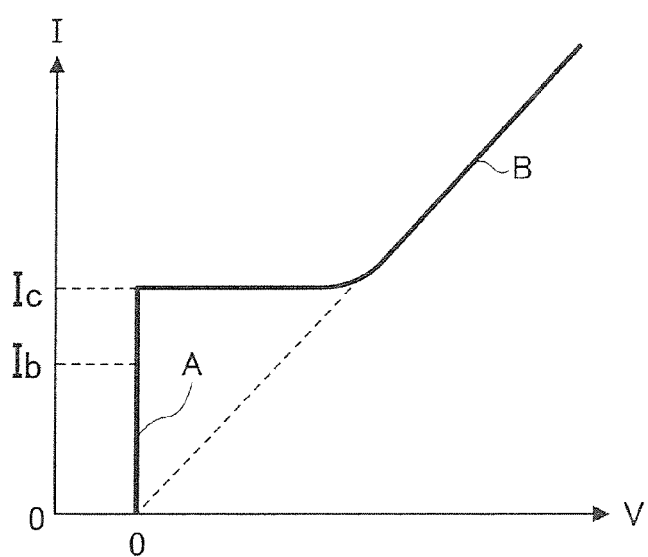
FIG. 2 is a diagram for explaining the operation of the conventional superconducting junction circuit.
Figure 3:
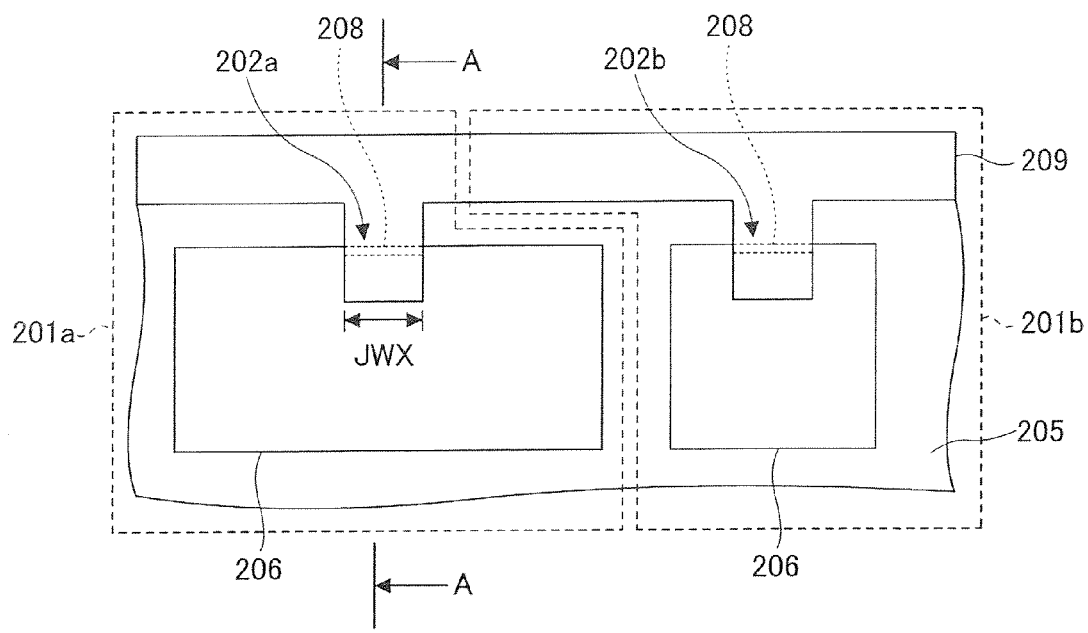
FIG. 3 is a plan view showing the superconducting junction circuit corresponding to the equivalent circuit diagram shown in FIG. 1.
Figure 4:
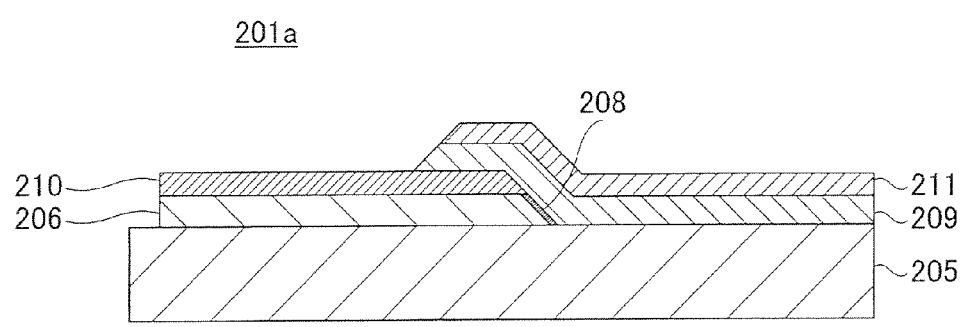
FIG. 4 is a cross sectional view taken along a line A-A in FIG. 3.

The basic operation of the superconducting junction circuit 10 is similar to that of the conventional superconducting junction circuit 200 shown in FIG. 1. When a current pulse caused by the flux quantum is supplied form the input end, this current pulse is superimposed on the bias current Ib flowing through the superconducting junction $16_1$, and a switching occurs from the "zero voltage state A" which is a superconducting state to the "finite voltage state B" because the current flowing through the superconducting junction $16_1$ exceeds the critical current Ic as shown in FIG. 2 described above. In addition, a current pulse caused by the flux quantum flows to the adjacent superconducting junction $16_2$ when the superconducting junction $16_1$ switches to the "finite voltage state B", and the superconducting junction $16_2$ similarly switches from the "zero voltage state A" to the "finite voltage state B". The flux quantum similarly propagates successively to the other adjacent superconducting junctions $16_3$ through $16_5$. Because each of the area of the lower electrode 14 and the width (junction width) of the lower electrode 14 is set to be approximately the same for each of the superconducting junctions $16_1$ through $16_5$ of the superconducting junction circuit 10, the critical current also becomes approximately the same for each of the superconducting junctions $16_1$ through $16_5$. Therefore, the switching operation of each of the superconducting junctions $16_1$ through $16_5$ is stable, and the superconducting junction circuit 10 can stably propagate the flux quantum, to thereby stabilize the circuit operation thereof.

In order to investigate the relationship between the critical current (or critical current density) and the area of the lower electrode 14, the present inventors made circuits by varying the width and the depth of the lower electrode 14 and conducted experiments by measuring the critical current for such circuits.

Figure 8:
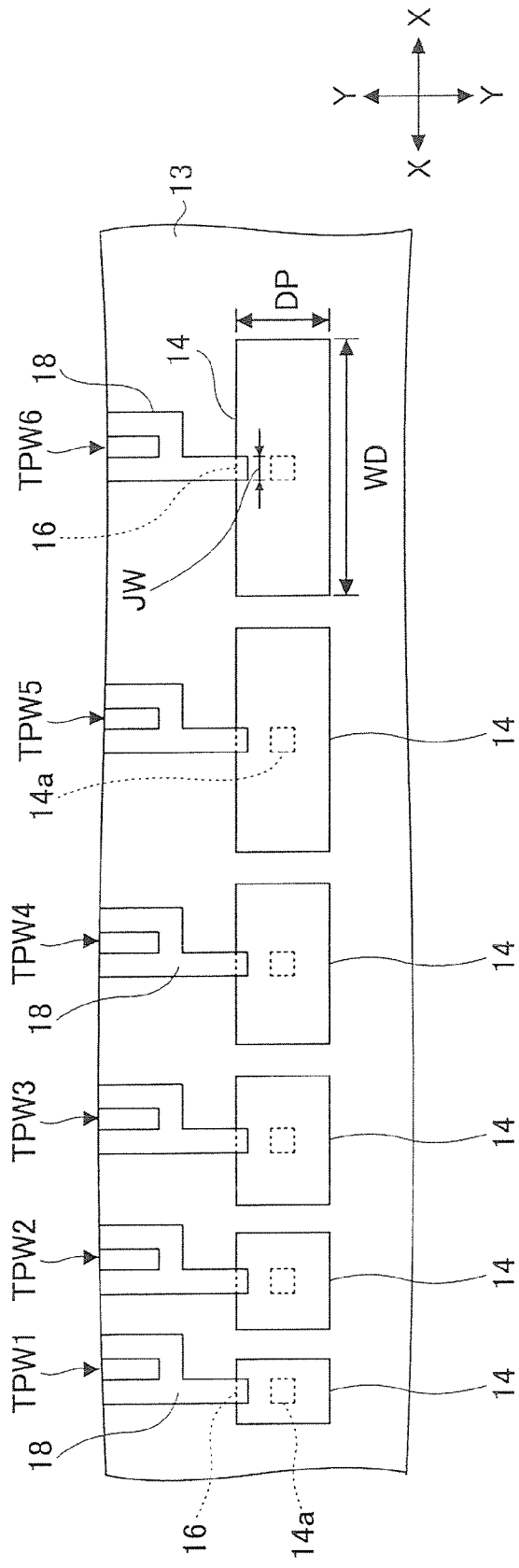
FIG. 8 is a plan view showing the superconducting junction circuit that was used for investigating a relationship between a critical current and a width of a lower electrode.

FIG. 8 is a plan view showing the superconducting junction circuit that was used for investigating the relationship between the critical current and the width of the lower electrode 14. As shown in FIG. 8, six superconducting junction elements TPW1 through TPW6 having the lower electrodes 14 with mutually different widths WD along the X-axis direction were formed on a single substrate. The cross section of each of the superconducting junction elements TPW1 through TPW6 was the same as that of the first embodiment shown in FIG. 6, and a detailed description thereof will be omitted.

The lower electrodes 14 of the superconducting junction elements TPW1 through TPW6 had widths WD that mutually differ and were set in a range of 10 μm to 100 μm. In addition, each of a depth DP of the lower electrode 14 along the Y-axis direction, a junction width JW of the superconducting junction 16, and the size of the contact hole 14a was set to be the same for each of the superconducting junction elements TPW1 through TPW6. The depth DP was 25 μm, the junction width JW was 5 μm, and the size of the contact hole 14a of the lower electrode 14 was 5 μm×5 μm. The distance between the contact hole 14a and the superconducting junction 16 was 10 μm. In addition, the upper electrode 18 was forked into two, one for connecting the D.C. current source 22 and another for connecting a voltmeter.

In the superconducting junction elements TPW1 through TPW6, the substrate 11 was made of MgO, the superconducting magnetic shielding layer 12, the lower electrode 14 and the upper electrode 18 were made of $La_{0.2}Y_{0.9}Ba_{1.9}Cu_3O_x$, the first and second interlayer insulators 13 and 15 were made of $SrSnO_3$, and the protection layer 19 was made of Au, for example. Furthermore, the thickness of the lower electrode 14 was 200 nm, the thickness of the upper electrode 18 was 200 nm, the inclined surface on which the barrier layer 17 is formed was approximately 30 degrees with respect to the substrate surface, and the junction area was approximately 2 μm². The superconducting magnetic shielding layer 12 and the lower electrode 14 were formed by D.C. sputtering. The upper electrode 18 was formed by pulsed laser deposition. The first and second interlayer insulators 13 and 15 and the protection layer 19 were formed by RF sputtering. In addition, the barrier layer 17 was formed on the end surface (sloping surface) of the lower electrode 14 by irradiating an Ar ion beam.

Figure 9:
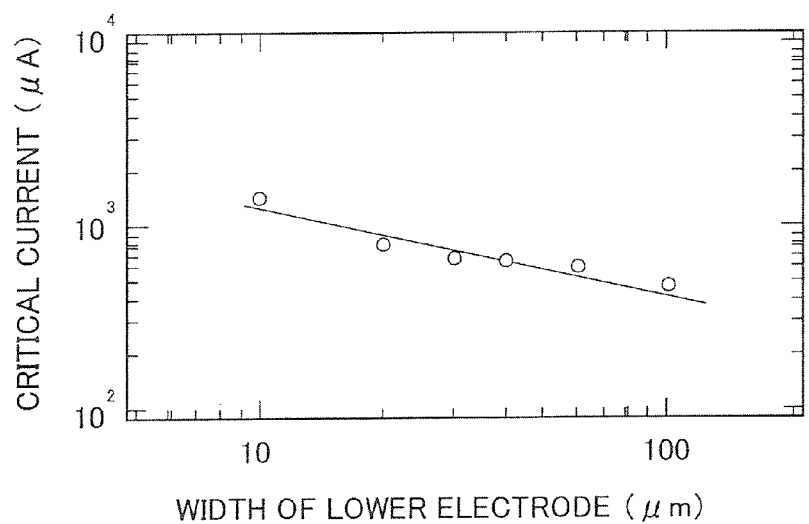
FIG. 9 is a diagram showing the relationship between the critical current and the width of the lower electrode.

FIG. 9 is a diagram showing the relationship between the critical current Ic and the width WD of the lower electrode 14. In FIG. 9, the ordinate indicates the critical current Ic, but since the junction areas of the superconducting junction elements TPW1 through TPW6 are approximately the same, FIG. 9 in effect shows the relationship between the critical current density and the width WD of the lower electrode 14.

As may be seen from FIG. 9, the critical current Ic has a negative correlation with respect to the width WD of the lower electrode 14. In other words, the critical current Ic (or the critical current density) decreases as the width WD of the lower electrode 14 increases.

A regression equation of the relationship between the critical current Ic and the width WD of the lower electrode 14 shown in FIG. 9 may be represented by the following formula (1), where WD denotes the width of the lower electrode 14 and Ic denotes the critical current.

$$Ic=(WD \times 1500)^{-0.19} \qquad (1)$$

When a rate of change, $\Delta WD$, is set with respect to the desired width WD in the formula (1), a rate of change, $\Delta Ic$, of the critical current Ic can be represented by the following formula (2).

$$\Delta Ic=(\Delta WD+1)^{-0.19}-1 \qquad (2)$$

For example, if $\Delta WD$ is −0.3, that is, is set to 70% of the desired width WD, $\Delta Ic=0.7^{-0.19}-1=0.07$ from the above formula (2), and an increase of 7% occurs with respect to the desired critical current Ic.

On the other hand, if $\Delta WD$ is +0.3, that is, is set to 130% of the desired width WD, $\Delta Ic=1.3^{-0.19}-1=-0.049$ from the above formula (2), and a decrease of 4.9% occurs with respect to the desired critical current Ic.

Therefore, according to the above formula (2), it may be seen that in order to set the inconsistency ("standard deviation σ"/"average value Avg") of the critical current Ic within a range of 0 to 5%, which is needed for stable operation of the circuit, the inconsistency ("standard deviation σ1"/"average value Avg1") of the width WD of the lower electrode 14 must be set within a range of 0 to 23%.

This relationship between the critical current Ic and the width WD of the lower electrode 14 similarly stands between the critical current density and the width WD of the lower electrode 14. Accordingly, it is possible to similarly control the inconsistency of the critical current density by controlling the inconsistency ("standard deviation σ1"/"average value Avg1") of the width WD of the lower electrode 14. Further, it is possible to set the critical current Ic to a desired value by the junction width JW of the superconducting junction 16.

Next, in order to investigate the relationship between the critical current Ic (or the critical current density) and the depth DP of the lower electrode 14, the present inventors conducted the following experiments.

Figure 10:
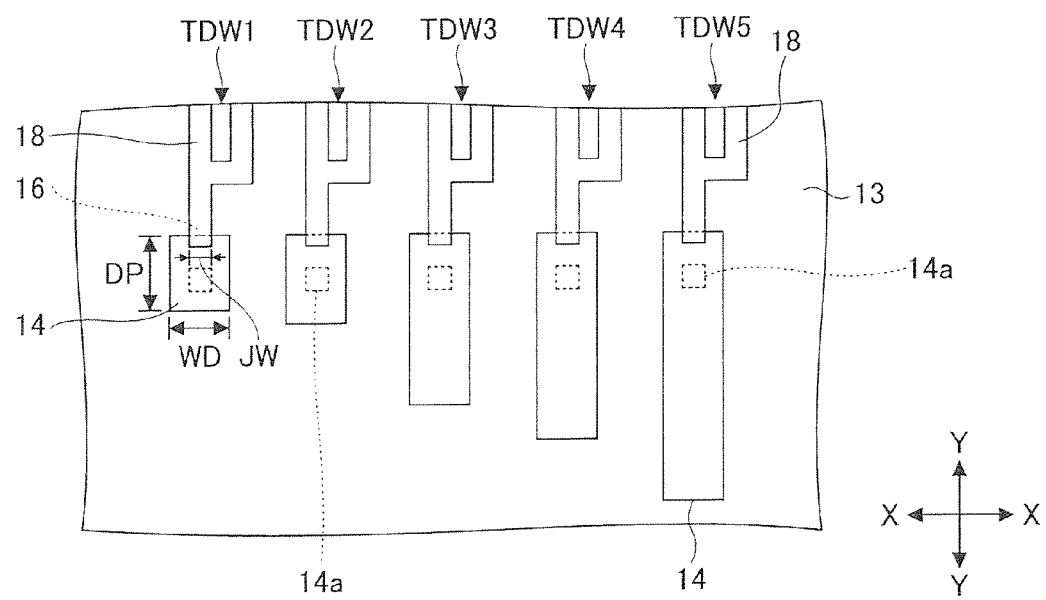
FIG. 10 is a plan view showing the superconducting junction circuit that was used for investigating a relationship between the critical current and a depth of the lower electrode.

FIG. 10 is a plan view showing the superconducting junction circuit that was used for investigating the relationship between the critical current Ic and the depth DP of the lower electrode 14. As shown in FIG. 10, five superconducting junction elements TPD1 through TPD5 having the lower electrodes 14 with mutually different depths DP along the Y-axis direction were formed on a single substrate. The structures, materials and thicknesses of the layers used for the superconducting junction elements TPD1 through TPD5 were the same as those shown in FIG. 8, and a detailed description thereof will be omitted.

The lower electrodes 14 of the superconducting junction elements TPD1 through TPD5 had depths DP that mutually differ and were set in a range of 15 μm to 105 μm. In addition, each of the width WD of the lower electrode 14 along the X-axis direction, the junction width JW of the superconducting junction 16, and the size of the contact hole 14a was set to be the same for each of the superconducting junction elements TPD1 through TPD5. The width WD was 15 μm, the junction width JW was 5 μm, and the size of the contact hole 14a of the lower electrode 14 was 5 μm×5 μm. The distance between the contact hole 14a and the superconducting junction 16 was 10 μm.

Figure 11:
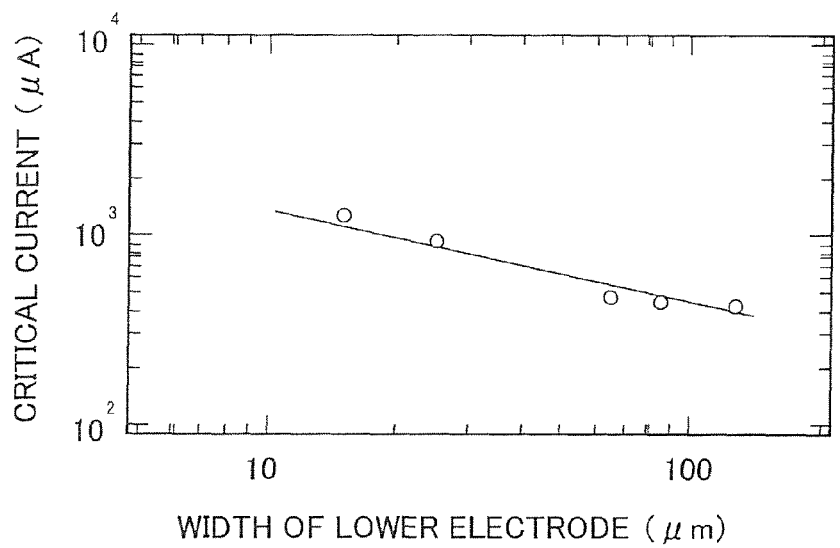
FIG. 11 is a diagram showing the relationship between the critical current and the depth of the lower electrode.

FIG. 11 is a diagram showing the relationship between the critical current Ic and the depth DP of the lower electrode 14. In FIG. 11, the ordinate indicates the critical current Ic, but since the junction areas of the superconducting junction elements TPD1 through TPD5 are approximately the same, FIG. 11 in effect shows the relationship between the critical current density and the depth DP of the lower electrode 14.

As may be seen from FIG. 11, the critical current Ic has a negative correlation with respect to the depth DP of the lower electrode 14. In other words, the critical current Ic (or the critical current density) decreases as the depth DP of the lower electrode 14 increases.

A regression equation of the relationship between the critical current Ic and the depth DP of the lower electrode 14 shown in FIG. 11 may be represented by the following formula (3), where DP denotes the depth of the lower electrode 14 and Ic denotes the critical current.

$$Ic=(DP \times 1300)^{-0.19} \qquad (3)$$

When a rate of change, $\Delta DP$, is set with respect to the desired depth DP in the formula (3), a rate of change, $\Delta Ic$, of the critical current Ic can be represented by the following formula (4).

$$\Delta Ic=(\Delta DP+1)^{-0.19}-1 \qquad (4)$$

The formula (4) is the same as the formula (2) except that $\Delta WD$ is replaced by $\Delta DP$. Therefore, according to the above formula (4), it may be seen that in order to set the inconsistency ("standard deviation σ"/"average value Avg") of the critical current Ic within a range of 0 to 5%, the inconsistency ("standard deviation σ2"/"average value Avg2") of the depth DP of the lower electrode 14 must be set within a range of 0 to 23%.

This relationship between the critical current Ic and the depth DP of the lower electrode 14 similarly stands between the critical current density and the depth DP of the lower electrode 14. Accordingly, it is possible to similarly control the inconsistency of the critical current density by controlling the inconsistency ("standard deviation σ2"/"average value Avg2") of the depth DP of the lower electrode 14. Further, it is possible to set the critical current Ic to a desired value by the junction width JW of the superconducting junction 16.

As may be readily understood from the description given above, it is possible to control the critical current density and the critical current Ic with a high accuracy, based on both the width WD and the depth DP of the lower electrode 14. In other words, even in the case of a superconducting junction circuit having superconducting junctions that are designed to have various critical current values, each of the width WD and the depth DP of the lower electrode 14 may be set approximately the same for each of the superconducting junctions so as to make the critical current density approximately the same for each of the superconducting junctions, and it is further possible to set the critical current Ic based on the junction width JW of the superconducting junction 16.

Moreover, the formulas (2) and (4) are the same except that $\Delta WD$ in the formula (2) is replaced by $\Delta DP$ in the formula (4). Hence, it may be seen that the effect on the rate of change, $\Delta Ic$, of the critical current Ic, is approximately the same for the width WD and the depth DP of the lower electrode 14. It may thus be expected that the critical current density and the critical current Ic can be controlled with a high accuracy based on the product of the width WD and the depth DP of the lower electrode 14, that is, based on the area of the lower electrode 14.

In the two experiments described above conducted by the present inventors, the lower electrode 14 has a rectangular shape, including a square shape. However, it may be expected that the critical current density and the critical current Ic can be controlled with a high accuracy based on the area of the lower electrode 14 similarly for cases where the lower electrode 14 has other shapes including polygonal shapes such as a diamond shape, a circular shape and an oval shape.

The present inventors also found that, in addition to the width WD and the depth DP of the lower electrode 14, the area of the contact hole connecting the lower electrode 14 and the superconducting magnetic shielding layer 12 also affects the critical current Ic and the critical current density. The present inventors conducted the following experiment to investigate the relationship between the critical current Ic (or the critical current density) and the area of the contact hole formed in the lower electrode 14.

Figure 12:
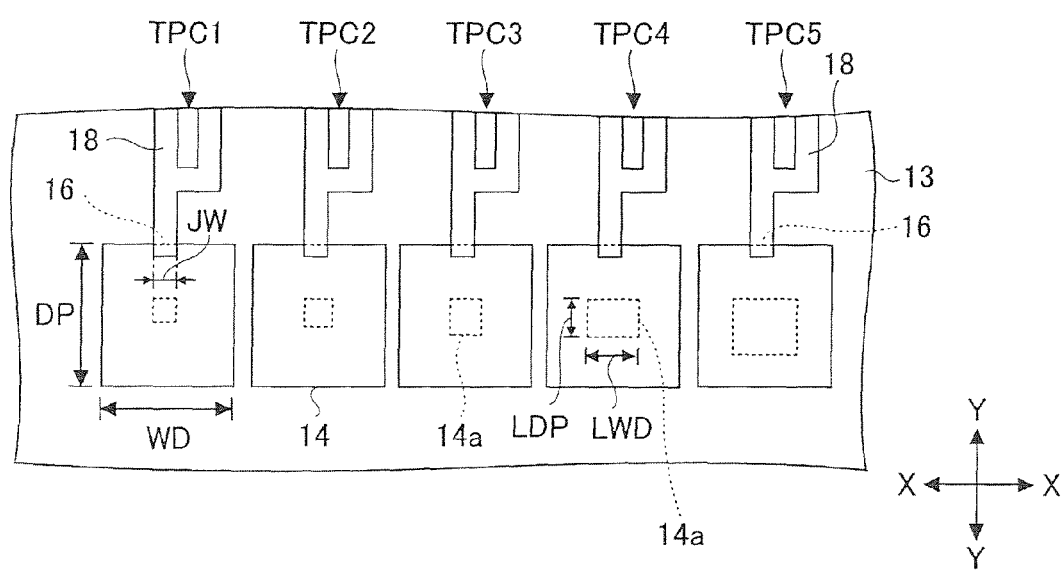
FIG. 12 is a plan view showing the superconducting junction circuit that was used for investigating a relationship between the critical current and a contact hole area of the lower electrode.

FIG. 12 is a plan view showing the superconducting junction circuit that was used for investigating the relationship between the critical current Ic and the contact hole area of the lower electrode 14. As shown in FIG. 12, five superconducting junction elements TPC1 through TPC5 only differing in the contact hole sizes of the lower electrodes 14 were formed on a single substrate. As described above in conjunction with FIG. 6, each contact hole 14a was formed at the interface between the lower electrode 14 and the first interlayer insulator 13, on an inner side (that is, left side in FIG. 6) of a boundary where the lower electrode 14 starts to slope in the direction taken along the thickness of the first interlayer insulator 13 from the flat state. Otherwise, the structures, materials and thicknesses of the layers used for the superconducting junction elements TPC1 through TPC5 were the same as those shown in FIG. 8, and a detailed description thereof will be omitted.

The lower electrodes 14 of the superconducting junction elements TPC1 through TPC5 had contact holes 14a having area that mutually differ and were set in a range of 16 $\mu m^2$ to 400 $\mu m^2$. More particularly, the contact holes 14a in the lower electrodes 14 of the superconducting junction elements TPC1 through TPC5 respectively had sizes, represented in width× depth, of 4 $\mu m$×4 $\mu m$, 8 $\mu m$×8 $\mu m$, 12 $\mu m$×12 $\mu m$, 16 $\mu m$×16 $\mu m$, and 20 $\mu m$×20 $\mu m$. In addition, each of the width WD and the depth DP of the lower electrode 14 and the junction width JW of the superconducting junction 16 was set to be the same for each of the superconducting junction elements TPC1 through TPC5. The width WD was 35 $\mu m$, depth DP was 35 $\mu m$, the junction width JW was 5 $\mu m$, and distance between the contact hole 14a and the superconducting junction 16 was 8 $\mu m$.

Figure 13:
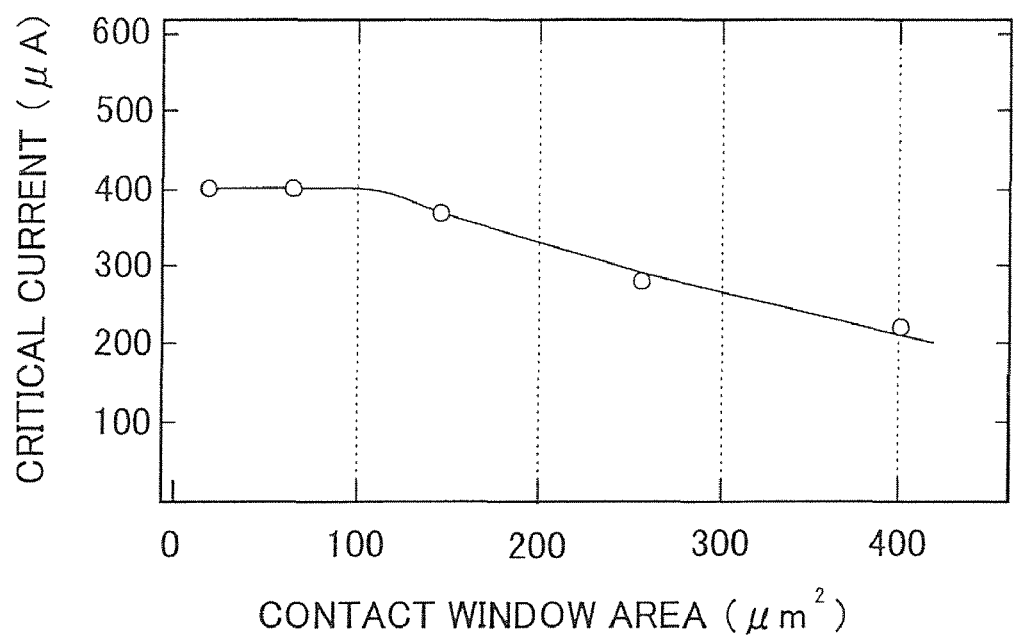
FIG. 13 is a diagram showing the relationship between the critical current and the contact hole area of the lower electrode.

FIG. 13 is a diagram showing the relationship between the critical current Ic and the contact hole area of the lower electrode 14. In FIG. 13, the ordinate indicates the critical current Ic, but since the junction areas of the superconducting junction elements TPC1 through TPC5 are approximately the same, FIG. 13 in effect shows the relationship between the critical current density and the contact hole area of the lower electrode 14.

As may be seen from FIG. 13, the critical current Ic virtually does not change when the contact hole area of the lower electrode 14 is 100 $\mu m^2$ or less and greater than 0, and has a tendency of gradually decreasing when the contact hole area of the lower electrode 14 exceeds 100 $\mu m^2$. From this tendency of the characteristic curve shown in FIG. 13, it was found that there is virtually no change (or only an extremely small change occurs) even when the area of the contact hole 14a in the lower electrode 14 is less than 16 $\mu m^2$, and for this reason, the area of the contact hole 14a in the lower electrode 14 may be set to less than 16 $\mu m^2$. However, from the point of view of forming the contact hole 14a in the lower electrode 14 with ease, it is preferable to set the area of the contact hole 14a in the lower electrode 14 to 16 $\mu m^2$ or greater.

The mechanism that causes the area of the contact hole 14a in the lower electrode 14 to affect the critical current Ic (or the critical current density) is unclear. However, the present inventors have surmised that the heat radiation state of the lower electrode 14 changes when forming the lower electrode 14, depending on the size of the contact hole 14a, and that the change in the magnitude of the internal stress generated in the lower electrode 14 causes the change in the critical current Ic (or the critical current density) to change.

According to this first embodiment described heretofore, it is possible to control the critical current density and the critical current of the superconducting junction based on the area of the lower electrode. Particularly when the area of the lower electrode is set substantially the same for each of the superconducting junction elements, it is possible to suppress the inconsistency of the critical current density and the critical current of the superconducting junction among the superconducting junction elements. In addition, by controlling the junction width of the superconducting junction for each of the superconducting junction elements, it is possible to form a superconducting junction circuit having the superconducting junction elements with a desired critical current.

Moreover, by setting the area of the contact hole in the lower electrode within a predetermined range (greater than 0 and less than or equal to 100 $\mu m^2$), it is possible to further suppress the inconsistency in the critical current density and the critical current of the superconducting junction among the superconducting junction elements. As a result, it is possible to realize a superconducting junction circuit that operates stably.

Second Embodiment

A description will be given of a second embodiment of the superconducting junction circuit according to the present invention. This second embodiment is an application of the superconducting junction circuit of the first embodiment described above. In this second embodiment, the superconducting junction circuit is provided with the so-called toggle flip-flop circuit.

Figure 14:
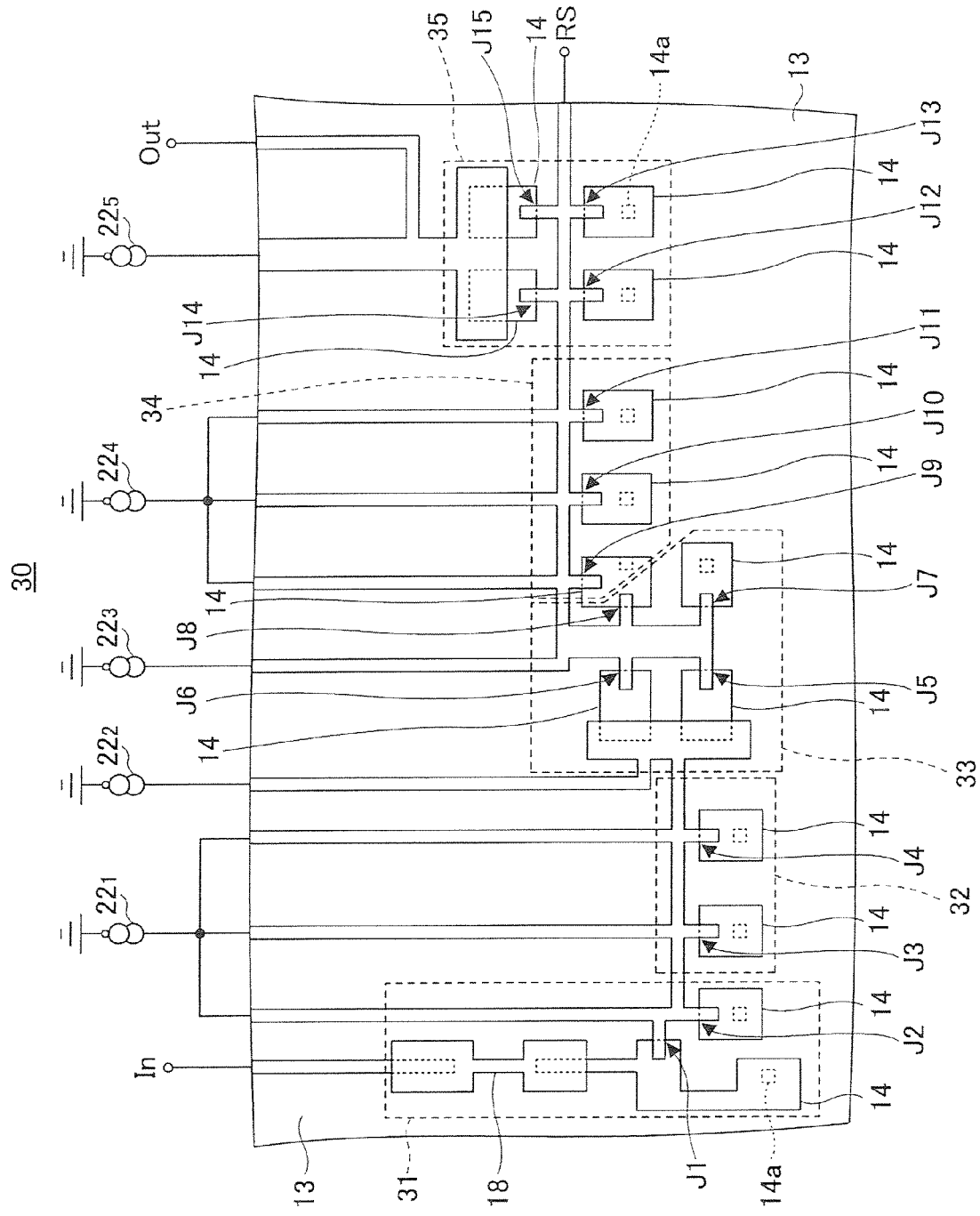
FIG. 14 is a plan view showing a second embodiment of the superconducting junction circuit according to the present invention.
Figure 15:
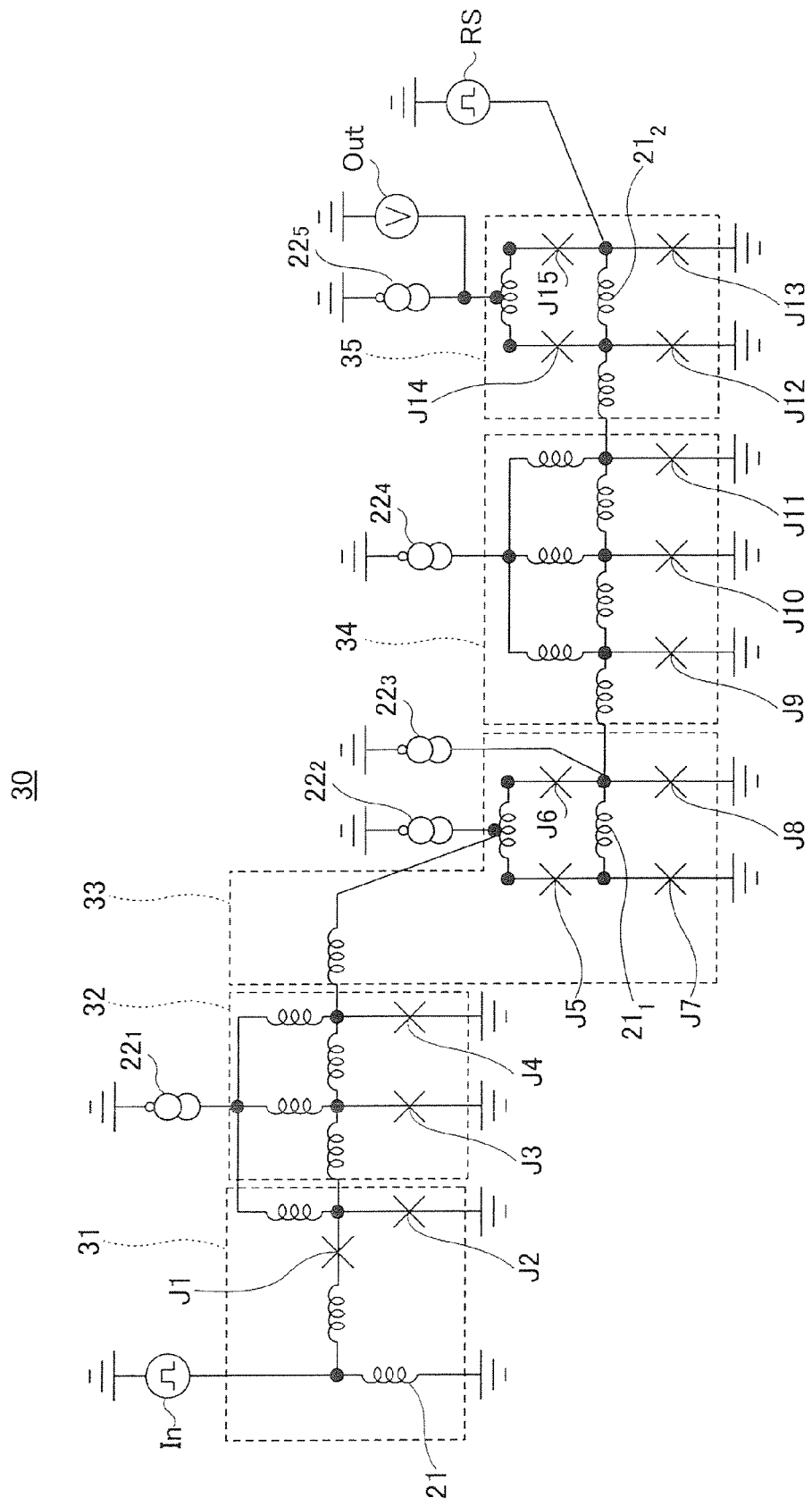
FIG. 15 is an equivalent circuit diagram of the superconducting junction circuit shown in FIG. 14.

FIG. 14 is a plan view showing this second embodiment of the superconducting junction circuit according to the present invention, and FIG. 15 is an equivalent circuit diagram of the superconducting junction circuit shown in FIG. 14. In FIGS. 14 and 15, those parts that are the same as those shown in FIGS. 5 through 7 are designated by the same reference numerals, and a description thereof will be omitted.

As shown in FIGS. 14 and 15, a superconducting junction circuit 30 of this second embodiment has an input end conversion circuit 31 for converting an electrical signal into a flux quantum signal, an input end superconducting transmission line 32 for propagation of the flux quantum, a toggle flip-flop circuit 33 having an output state that successively changes when supplied with the flux quantum, an output end superconducting transmission line 34 for propagation of the flux quantum, and an output end conversion circuit 35 for converting the flux quantum signal into the electrical signal. The superconducting junction circuit 30 that is formed by these constituent circuits 31 through 35 is made up of a combination of superconducting junctions J1 through J15, inductors 21, and D.C. current sources $22_1$ through $22_5$.

A description will now be given of an operation of the superconducting junction circuit 30.

In the input end conversion circuit 31, when a current pulse is supplied to an input part In, a current flowing through the superconducting junction J2 increases. When a sum of the bias current from the D.C. current source $22_1$ and the current pulse exceeds the critical current, the switching of the superconducting junction J2 occurs and a current pulse caused by flux quantum is generated. The generated flux quantum propagates to the input end superconducting transmission line 32. It is assumed for the sake of convenience that the "switching" of the superconducting junction refers to the transition from the "zero voltage state A" to the "finite voltage state B".

In the input end superconducting transmission line 32, the flux quantum successively propagates through the superconducting junctions J3 and J4 at a high speed, and the shaping of the current pulse waveform occurs due to the flux quantum.

In the toggle flip-flop circuit 33, in a state before the current pulse caused by the flux quantum is supplied thereto, the bias current from the D.C. current source $22_2$ flows towards the ground via the superconducting junctions J6, J5 and J7, and also flows towards the ground via the superconducting junction J8. In this state, when the flux quantum is supplied to the toggle flip-flop circuit 33, the switching of the superconducting junction J5 occurs due to the flux quantum because the bias current and the current pulse flow in the same direction, but the switching of the superconducting junction J6 does not occur because its critical current is set slightly larger than that of the superconducting junction J5. The current pulse that flows through the superconducting junction J6 flows to the superconducting junction J8. The switching of the superconducting junction J8 occurs because the bias current and the current pulse flow in the same direction, and the flux quantum is output to the output end superconductor line 34.

Simultaneously as this output of the flux quantum, flux quanta with opposite directions are generated in the upper loop including the superconducting junctions J5 and J6 and the lower loop including the superconducting junctions J7 and J8. These flux quanta are held (a continuous current flows) since the switching does not occur in any of the superconducting junctions J5, J6 and J7. In this state, a circulating current flows from the superconducting junction J8 towards the superconducting junction J7 via the inductor 21, in the lower loop. In addition, a circulating current flows in the upper loop from the superconducting junction J5 towards the superconducting junction J6 via the inductor $21_1$.

When the next flux quantum is supplied to the toggle flip-flop circuit 33, the switching of the superconducting junction J6 occurs because the circulating current and the current pulse caused the flux quantum flow in the same direction, to thereby stop the current pulse, and the superconducting junction J5 passes the current pulse due to the cancellation of the currents. In addition, the switching of the superconducting junction J7 occurs because the circulating current and the current pulse flow in the same direction, and the flux quantum is output outside the toggle flip-flop circuit 33. The current pulse also flows from the superconducting junction J7 towards the superconducting junction J8 via the inductor $21_1$, however, the critical current is not exceeded in each of the superconducting junctions J7 and J8 and the switching of the superconducting junctions J7 and J8 does not occur, and the current flowing to the inductor $21_1$ is cancelled and returned to the initial state.

The operation described above is repeated in a similar manner, so as to output one of the two flux quanta that are supplied time-sequentially to the output end superconducting transmission line 34.

In the output end superconducting transmission line 34, the flux quantum successively propagates through the superconducting junctions J9 through J11 at a high speed, and the shaping of the current pulse waveform occurs due to the flux quantum, similarly as in the case of the input end superconducting transmission line 32.

In the output end conversion circuit 35, when the current pulse caused by the flux quantum is supplied thereto, the switching of the superconducting junction J12 occurs, and the flux quantum is held in the loop that is formed by the superconducting junction J12, the inductor $21_2$ and the superconducting junction J13. Of the loops which have the inductor $21_2$ in common, a circulating current flows in the loop from the inductor $21_2$ towards the superconducting junction J15 via the superconducting junction J14. But since the critical currents of the superconducting junctions J14 and J15 are set lower than those of the superconducting junctions J12 and J13, the switching of the superconducting junctions J14 and J15 occurs and the superconducting junctions J14 and J15 assume the "finite voltage state B". In this state, when a reset signal from a reset signal input part RS is input to the superconducting junction J13, the "finite voltage state B" ends because the flux quantum is output outside the output end conversion circuit 35, and a pulse-shaped output signal is output from the superconducting junction circuit 30.

Figure 16:
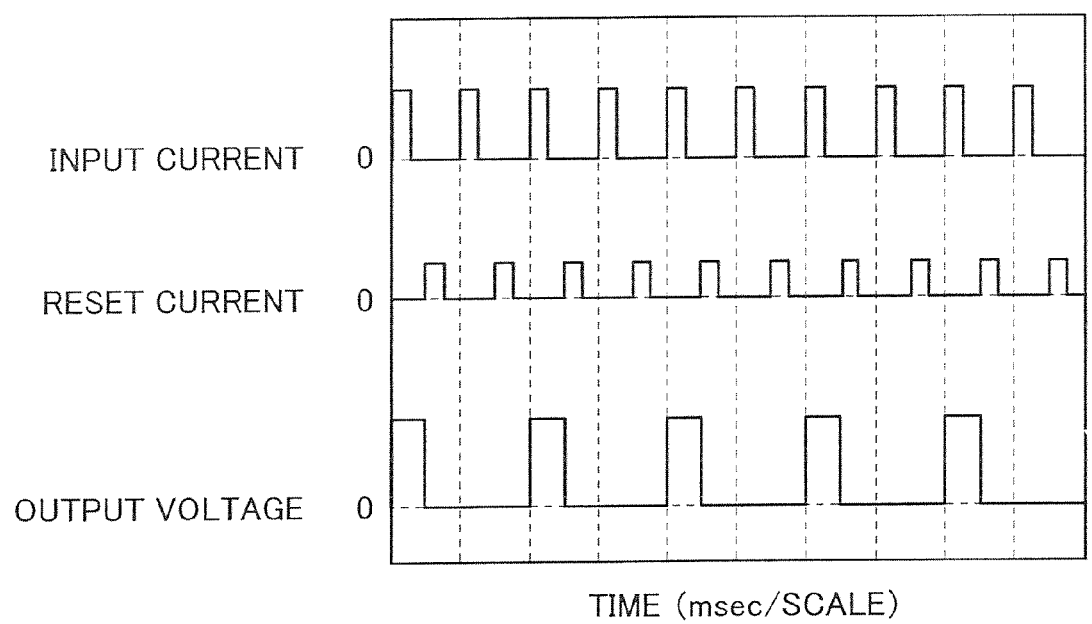
FIG. 16 is a diagram showing signal waveforms at various portions of the second embodiment of the superconducting junction circuit.

FIG. 16 is a diagram showing signal waveforms at various portions of this second embodiment of the superconducting junction circuit 30. A pulse-shaped input current shown in FIG. 16 is supplied to the input part In of the input end conversion circuit 31 shown in FIGS. 14 and 15. A pulse-shaped reset current shown in FIG. 16 is supplied to the reset signal input part RS of the output end conversion circuit 35 shown in FIGS. 14 and 15. A pulse-shaped output voltage shown in FIG. 16, which is made up of pulses corresponding to every other pulses of the input current, is output to an output part Out of the output end conversion circuit 35 shown in FIGS. 14 and 15. In FIG. 16, the pulses of the output voltage are generated approximately at the same timing as the rising edges of the pulses of the input current, because the signal propagates at a high speed with respect to one scale (1 msec) on the time base.

Returning now to the description of FIG. 14, each of the width and the depth of the lower electrode 14 is approximately the same for each of the superconducting junctions J1 through J15, except for the superconducting junctions J1. Hence, as described above in conjunction with the first embodiment, the critical current density is approximately the same for each of the superconducting junctions J2 through J15. For this reason, by setting a predetermined junction width with respect to each of the superconducting junctions J2 through J15, it is possible to set the critical current to a value that is required for the stable circuit operation by suppressing the inconsistency of the critical current.

In the case of the superconducting junction J1, the inductor is formed in the lower electrode 14, and the total area of the lower electrode 14 is greater than those of the other superconducting junctions J2 through J15. For example, the area of the lower electrode 14 of the superconducting junction J1 is set to approximately twice the area of the lower electrode 14 of each of the other superconducting junctions J2 through J15. In this case, it is possible to set a desired critical current based on the relationship between the critical current density and the area of the lower electrode 14 and the relationship between the critical current and the junction width.

According to this second embodiment in which the superconducting junction circuit 30 is made up of a combination of a large number of superconducting junction elements, it is possible to set the critical current density based on the area of the lower electrode 14, and the critical current density of each of the superconducting junctions can be made approximately the same by making the area of the lower electrode 14 approximately the same for each of the superconducting junctions. Furthermore, it is possible to control the critical current based on the junction width of the superconducting junction.

Next, a description will be given of a modification of this second embodiment and a comparison example.

Figure 17:
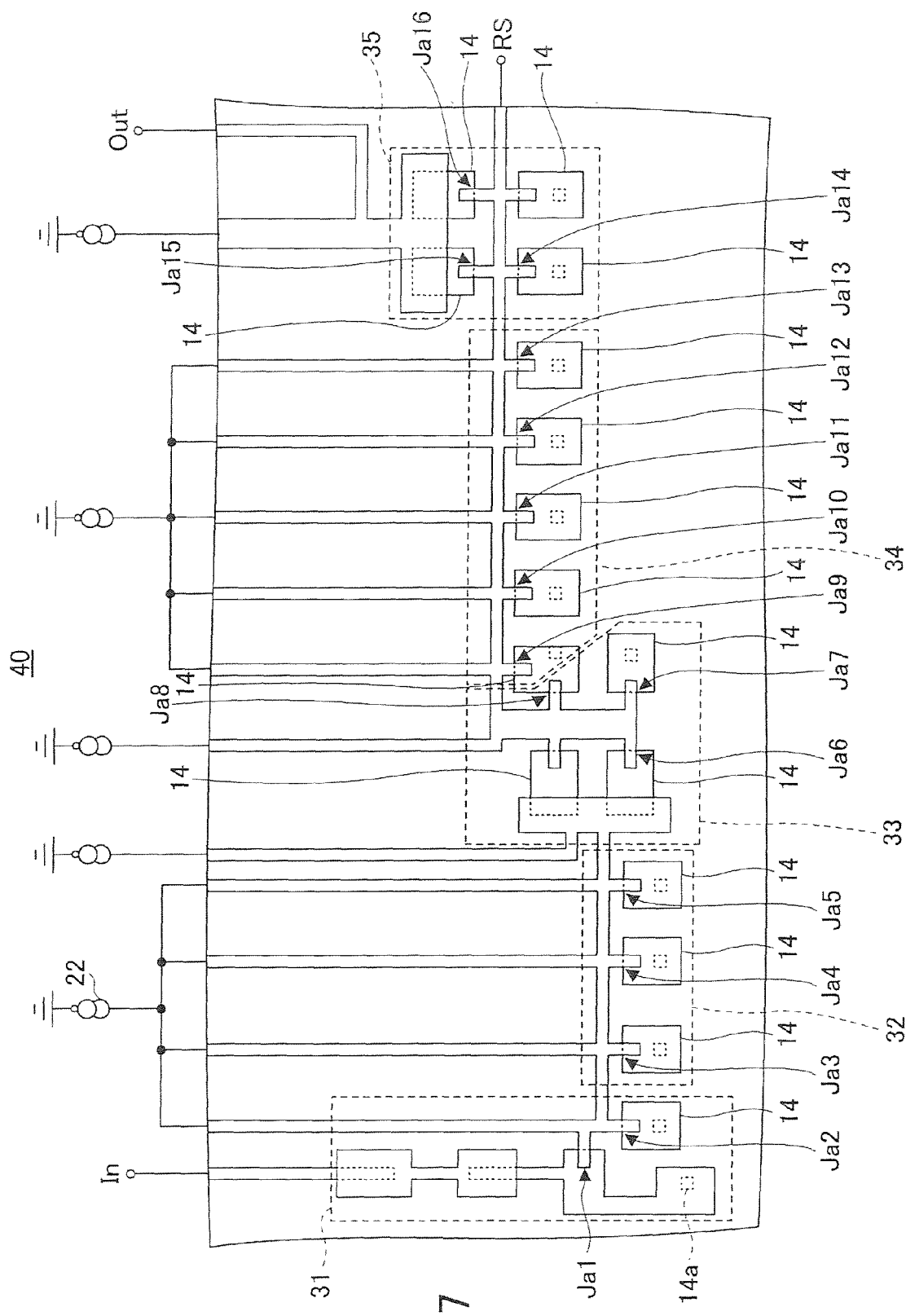
FIG. 17 is a plan view showing a modification of the second embodiment of the superconducting junction circuit.
Figure 18:
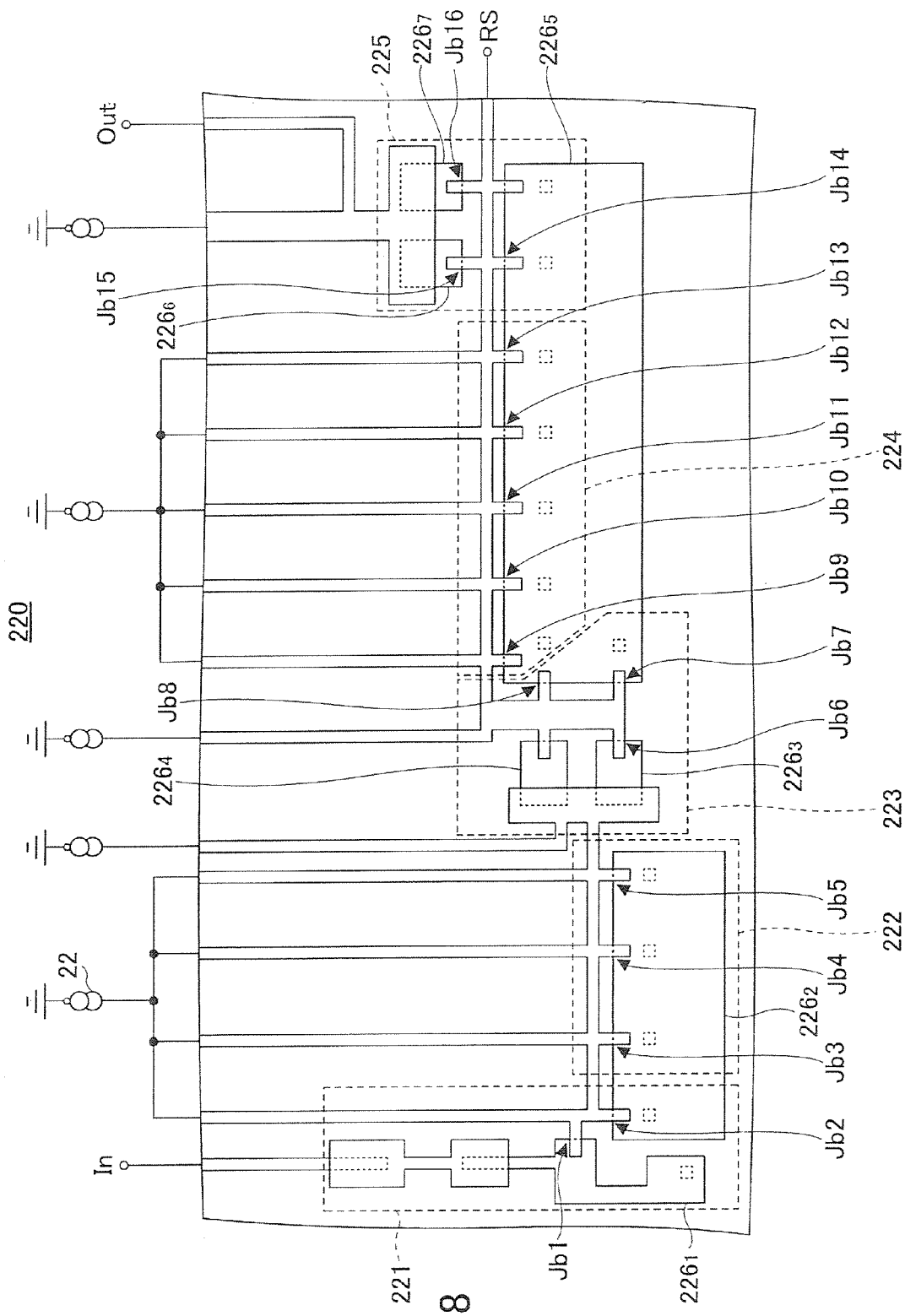
FIG. 18 is a plan view showing a comparison example of the superconducting junction circuit.

FIG. 17 is a plan view showing a modification of this second embodiment of the superconducting junction circuit, and FIG. 18 is a plan view showing a comparison example of the superconducting junction circuit. In FIGS. 17 and 18, those parts that are the same as those corresponding parts in FIGS. 14 and 15 are designated by the same reference numerals, and a description thereof will be omitted.

In a superconducting junction circuit 40 of this modification of the second embodiment shown in FIG. 17, one superconducting junction element is additionally provided in the input end superconducting transmission line 32 and two superconducting junction elements are additionally provided in the output end superconducting transmission line 34, when compared to those shown in FIG. 14. Otherwise, the superconducting junction circuit 40 shown in FIG. 17 is the same as the superconducting junction circuit 30 shown in FIG. 14. The area of the lower electrode 14 of a superconducting junction Ja1 of the input end conversion circuit 31 is 332 $\mu m^2$. The area of the lower electrode 14 of each of the other superconducting junctions Ja2 through Ja16 of the superconducting junction circuit 40 is 221 $\mu m^2$.

On the other hand, in a superconducting junction circuit 220 of this comparison example shown in FIG. 18, lower electrodes $226_1$ through $226_7$ have different areas. Otherwise, the superconducting junction circuit 220 shown in FIG. 18 has the same structure as the superconducting junction circuit 40 shown in FIG. 17. The areas of the lower electrodes $226_1$ through $226_7$ respectively are 332 $\mu m^2$, 2320 $\mu m^2$, 221 $\mu m^2$, 221 $\mu m^2$, 5600 $\mu m^2$, 221 $\mu m^2$ and 221 $\mu m^2$.

Figure 19:
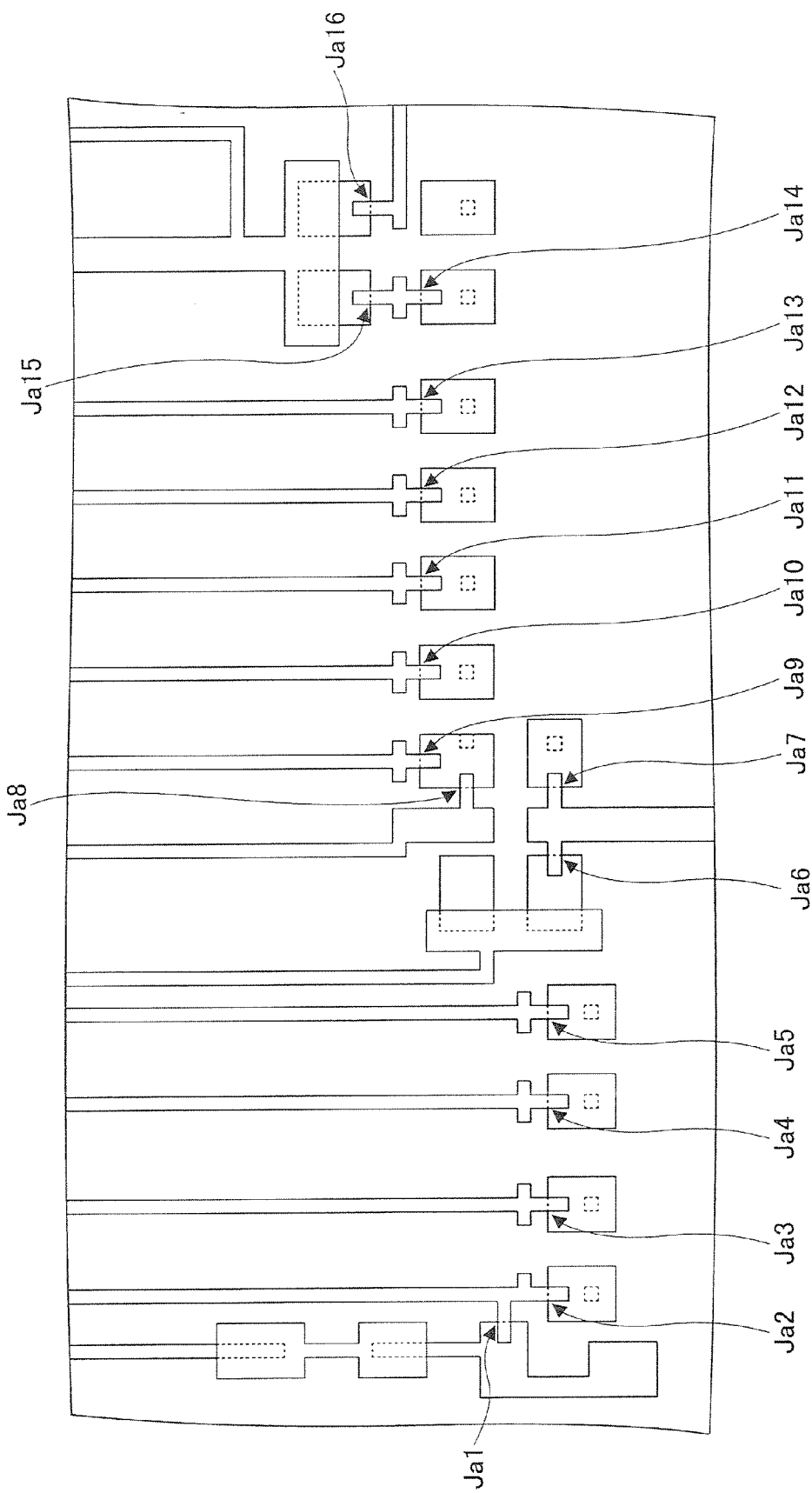
FIG. 19 is a plan view showing a circuit for measuring a critical current density of the modification of the second embodiment of the superconducting junction circuit.
Figure 20:
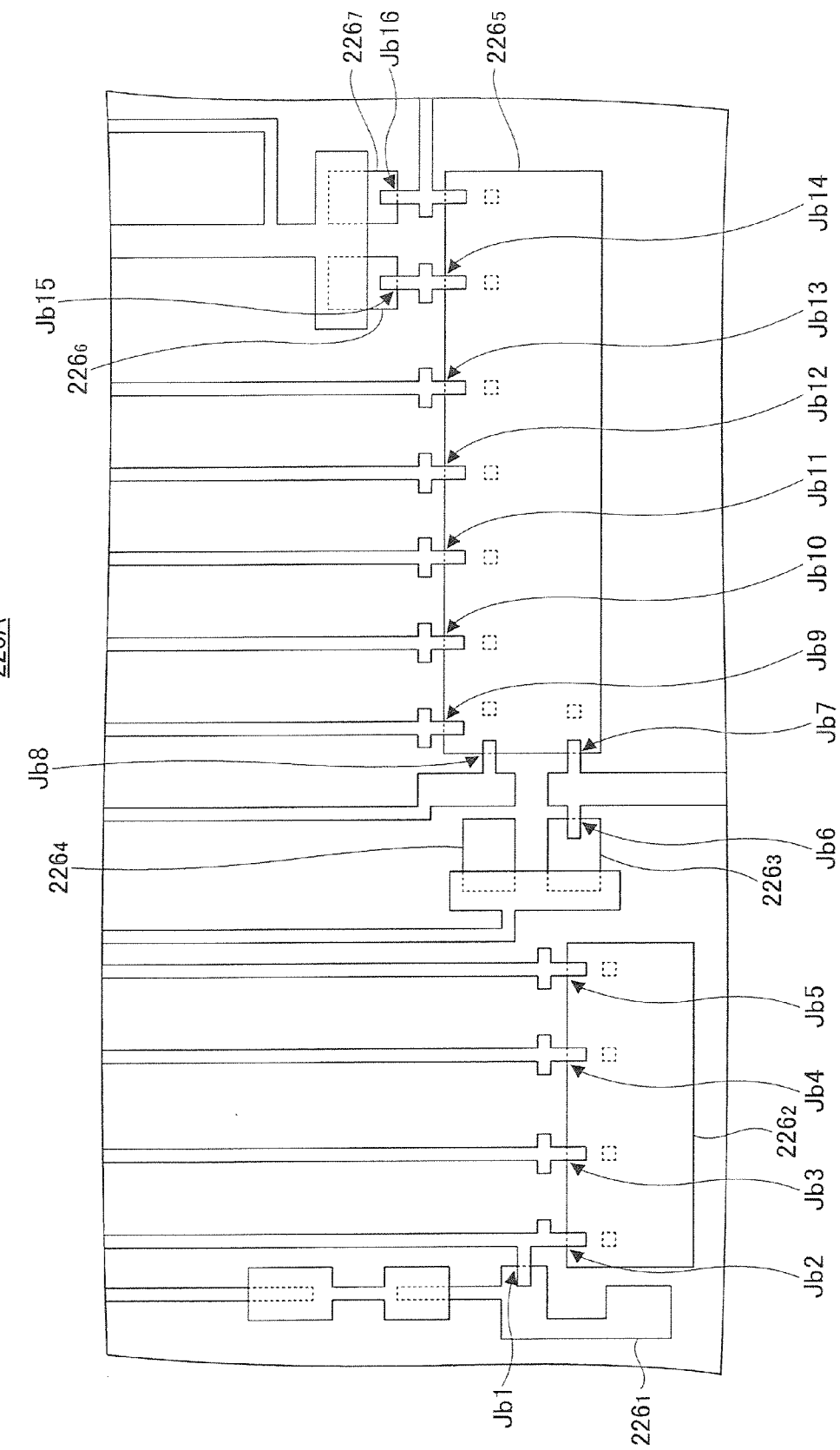
FIG. 20 is a plan view showing a circuit for measuring the critical current density of the comparison example of the superconducting junction circuit.

FIG. 19 is a plan view showing a circuit 40A for measuring a critical current density of this modification of the second embodiment of the superconducting junction circuit, and FIG. 20 is a plan view showing a circuit 120A for measuring the critical current density of the comparison example of the superconducting junction circuit.

In the circuit 40A shown in FIG. 19 for measuring the critical current of the superconducting junction circuit 40 shown in FIG. 17 and in the circuit 120A shown in FIG. 20 for measuring the critical current density of the superconducting junction circuit 120A shown in FIG. 18, the line through which the signal due to the flux quantum propagates was broken (or disconnected), so that the critical current of each superconducting junction element can be measured. Although the illustration thereof is omitted in FIGS. 19 and 20, a variable current source was connected to the corresponding upper electrode 18, and the superconducting magnetic shielding layer that was electrically connected to the corresponding one of the lower electrodes 14 and $226_1$ through $226_7$ is grounded. In addition, a voltmeter was connected in parallel to the superconducting junctions Ja1 through Ja16, and a voltmeter was connected in parallel to superconducting junctions Jb1 through Jb16. However, in the input end conversion circuit 31, the lower electrode 14 was not electrically connected to the superconducting magnetic shielding layer, and the input part In was grounded.

FIG. 21 is a diagram showing the critical current densities of this modification of the second embodiment and the comparison example. The average value and the standard deviation of the critical current densities of the superconducting junctions Jb1 through Jb16 of the comparison example was 56.8 kA/cm$^2$ and 15.4 kA/cm$^2$, respectively, and the ratio "standard deviation"/"average value" was 27.1%. On the other hand, the average value and the standard deviation of the critical current densities of the superconducting junctions Ja1 through Ja16 of this modification of the second embodiment was 121 kA/cm$^2$ and 10.5 kA/cm$^2$, respectively, and the ratio "standard deviation"/"average value" was 8.7%. Accordingly, when the ratios "standard deviation"/"average value" of the comparison example and this modification of the second embodiment are compared, it may be seen that the inconsistency of the critical current density in the superconducting junction circuit 40 of this modification of the second embodiment is reduced considerably compared to the inconsistency of the critical current density in the superconducting junction circuit 220 of the comparison example.

Third Embodiment

Figure 22:
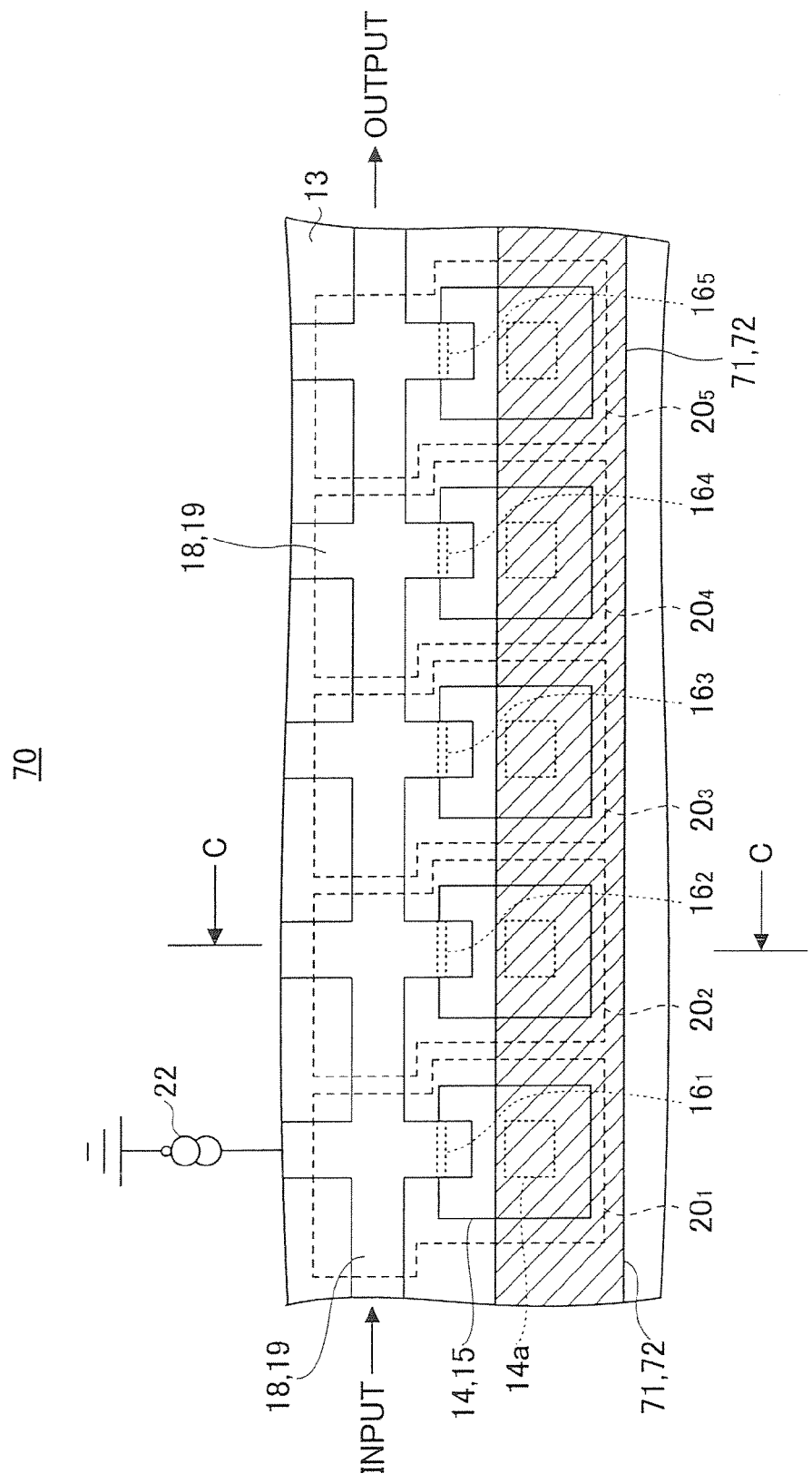
FIG. 22 is a plan view showing a third embodiment of the superconducting junction circuit according to the present invention.
Figure 23:
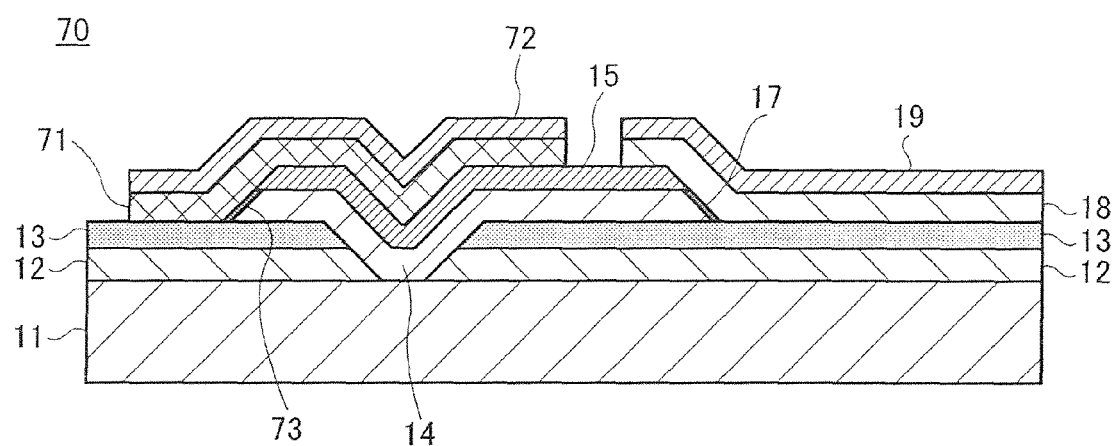
FIG. 23 is a cross sectional view taken along a line C-C in FIG. 22.

FIG. 22 is a plan view showing a third embodiment of the superconducting junction circuit according to the present invention, and FIG. 23 is a cross sectional view taken along a line C-C in FIG. 22. In FIGS. 22 and 23, those parts that are the same as those corresponding parts in FIGS. 5, 6 and 14 are designated by the same reference numerals, and a description thereof will be omitted.

In a superconducting junction circuit 70 of this third embodiment shown in FIGS. 22 and 23, a lower electrode connecting layer 71 and a protection layer 72 are additionally provided. The lower electrode connecting layer 71 contacts the surface of each lower electrode 14, and connects lower electrodes 14. The protection layer 72 covers the lower electrode connecting layer 71. Otherwise, the superconducting junction circuit 70 is the same as the superconducting junction circuit 10 of the first embodiment described above.

The lower electrode connecting layer 71 is made of a superconductor material, and is formed along each lower electrode 14 so as to cover the inclined surface formed at the side portion of each lower electrode 14 and portions of the surfaces of the first and second interlayer insulators 13 and 15. The superconductor material forming the lower electrode connecting layer 71 may be the same as the material forming the upper and lower electrodes 18 and 14. In addition, the lower electrode connecting layer 71 is formed at a position that does not contact the upper electrode 18. By providing the lower electrode connecting layer 71, the current flowing from the upper electrode 18 to the lower electrode 14 via the superconducting junctions $16_1$ through $16_5$ not only flows via the superconducting magnetic shielding layer 12, but also flows via the lower electrode connecting layer 71. As a result, it is possible to reduce the inductance connecting two lower electrodes 14. Consequently, the flux quantum can be propagated at an even higher speed by the superconducting junction circuit 70.

The protection layer 72 is made of a material similar to that forming the protection layer 19. In addition, a barrier layer 73 is provided between the lower electrode 14 and the lower electrode connecting layer 71 in order to facilitate production when irradiating the ion beam on the entire surface of the lower electrode 14 to form the barrier layer 17. The barrier layer 73 forms a superconducting junction by the lower electrode 14 and the lower electrode connecting layer 71, but from the point of view of the circuit operation, this superconducting junction is always in the "zero voltage state A" and no switching of this superconducting junction will occur. This is because the junction width of this superconducting junction is considerably larger than the junction width of each of the superconducting junctions $16_1$ through $16_5$, and the critical current of this superconducting junction is extremely large compared to the critical current of each of the superconducting junctions $16_1$ through $16_5$. Of course, it is not essential to provide the barrier layer 73.

Even when the lower electrode connecting layer 71 is provided in each of the superconducting junction elements $20_1$ through $20_5$, the critical current density and the critical current of each superconducting junctions $16_1$ through $16_5$ can be controlled based on the area of each lower electrode 14.

The area in which the lower electrode connecting layer 71 and the lower electrode 14 make contact is not limited to a proportion with respect to the area of the lower electrode 14. But preferably, the lower electrode connecting layer 71 makes contact with as large a number of sides of the lower electrode 14 as possible, of the four sides of the lower electrode 14. However, the lower electrode connecting layer 71 must be provided at a position separated from the upper electrode 18 by an extent such that the lower electrode connecting layer 71 will not make contact with the upper electrode 18. Preferably, the side of the lower electrode connecting layer 71 is separated by 5 µm, for example, from the confronting side of the upper electrode 18.

According to this third embodiment, it is possible to reduce the inductance between two lower electrodes 14 by providing the lower electrode connecting layer 71, and the flux quantum can be propagated at an even higher speed by the superconducting junction circuit 70. In addition, the superconducting junction circuit 70 of this third embodiment can of course obtain the effects obtainable by the superconducting junction circuit 10 of the first embodiment.

Fourth Embodiment

A fourth embodiment of the superconducting junction circuit according to the present invention is a combination of the superconducting junction circuit 30 of the second embodiment shown in FIG. 14 and the superconducting junction circuit 70 of the third embodiment shown in FIG. 22.

Figure 24:
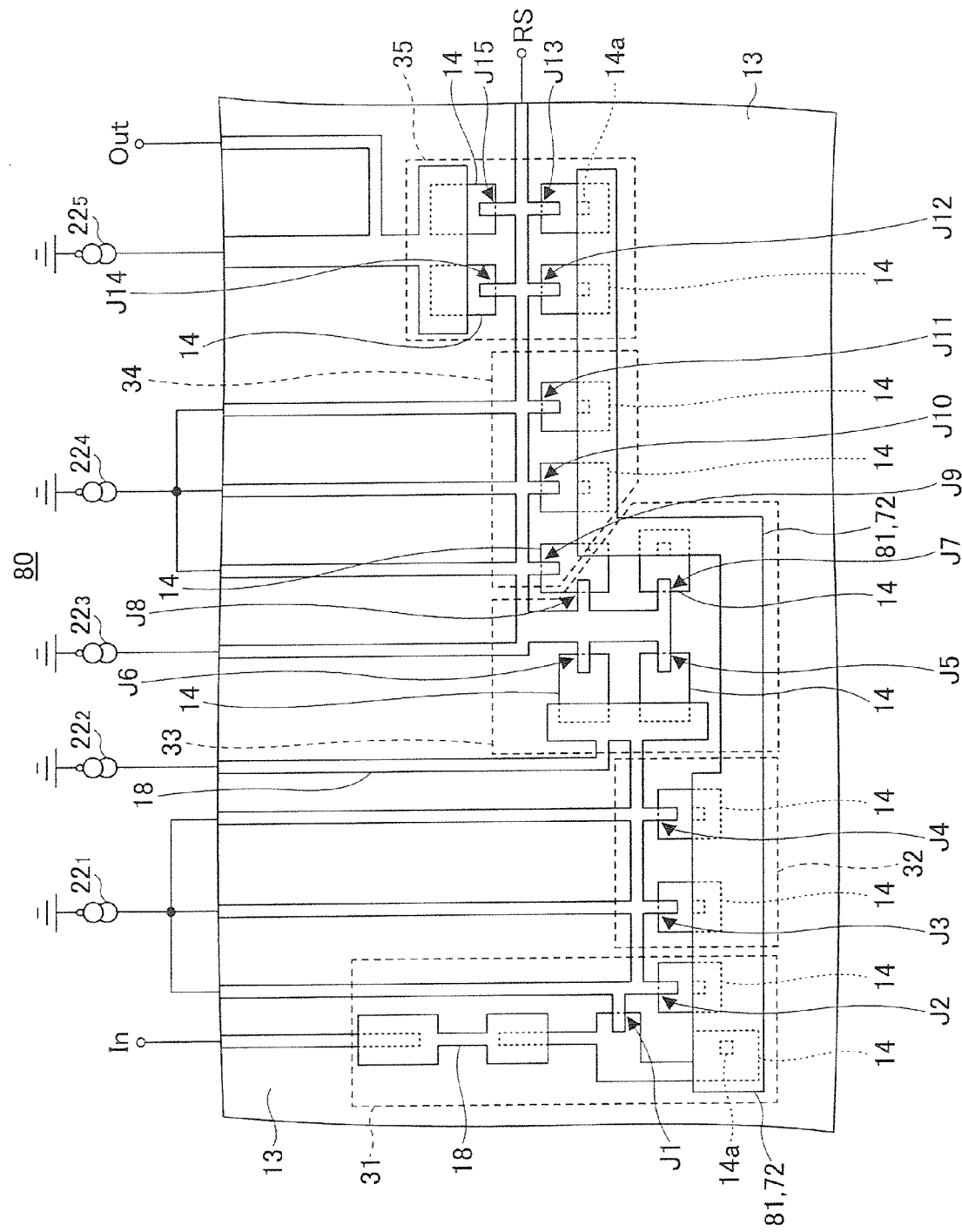
FIG. 24 is a plan view showing a fourth embodiment of the superconducting junction circuit according to the present invention.

FIG. 24 is a plan view showing this fourth embodiment of the superconducting junction circuit according to the present invention. In FIG. 24, those parts that are the same as those corresponding parts in FIGS. 14 and 22 are designated by the same reference numerals, and a description thereof will be omitted.

A superconducting junction circuit 80 of this fourth embodiment shown in FIG. 24 has a toggle flip-flop circuit 33 and a lower electrode connecting layer 81. Otherwise, the superconducting junction circuit 80 has a structure similar to that of the superconducting junction circuit 30 of the second embodiment shown in FIG. 14.

In the superconducting junction circuit 80, the lower electrode connecting layer 81 is made of a superconductor material and connects each of the lower electrodes 14. The lower electrode connecting layer 81 is formed along each lower electrode 14 so as to cover a portion of the surface of each lower electrode 14 and a portion of the surface of the first interlayer insulator 13 between the lower electrodes 14, in a manner similar to the lower electrode connecting layer 71 shown in FIG. 23. According to experiments conducted by the present inventors, the inductance between two lower electrodes 14 was 0.7 pH when no lower electrode connecting layer 81 was provided, but this inductance was reduced to 0.4 pH when the lower electrode connecting layer 81 was provided.

According to this fourth embodiment, it is possible to reduce the inductance between the lower electrodes 14 by providing the lower electrode connecting layer 81, and it is possible to realize the superconducting junction circuit 80 that can operate at a high speed. In addition, the superconducting junction circuit 80 of this fourth embodiment can of course obtain the effects obtainable by the superconducting junction circuit 30 of the second embodiment.

Although the superconducting junction circuit 80 connects the lower electrodes 14 by a single lower electrode connecting layer 81, it is of course possible to provide a plurality of lower electrode connecting layers 81 depending on the circuit pattern of the superconducting junction circuit 80.

Figure 25:
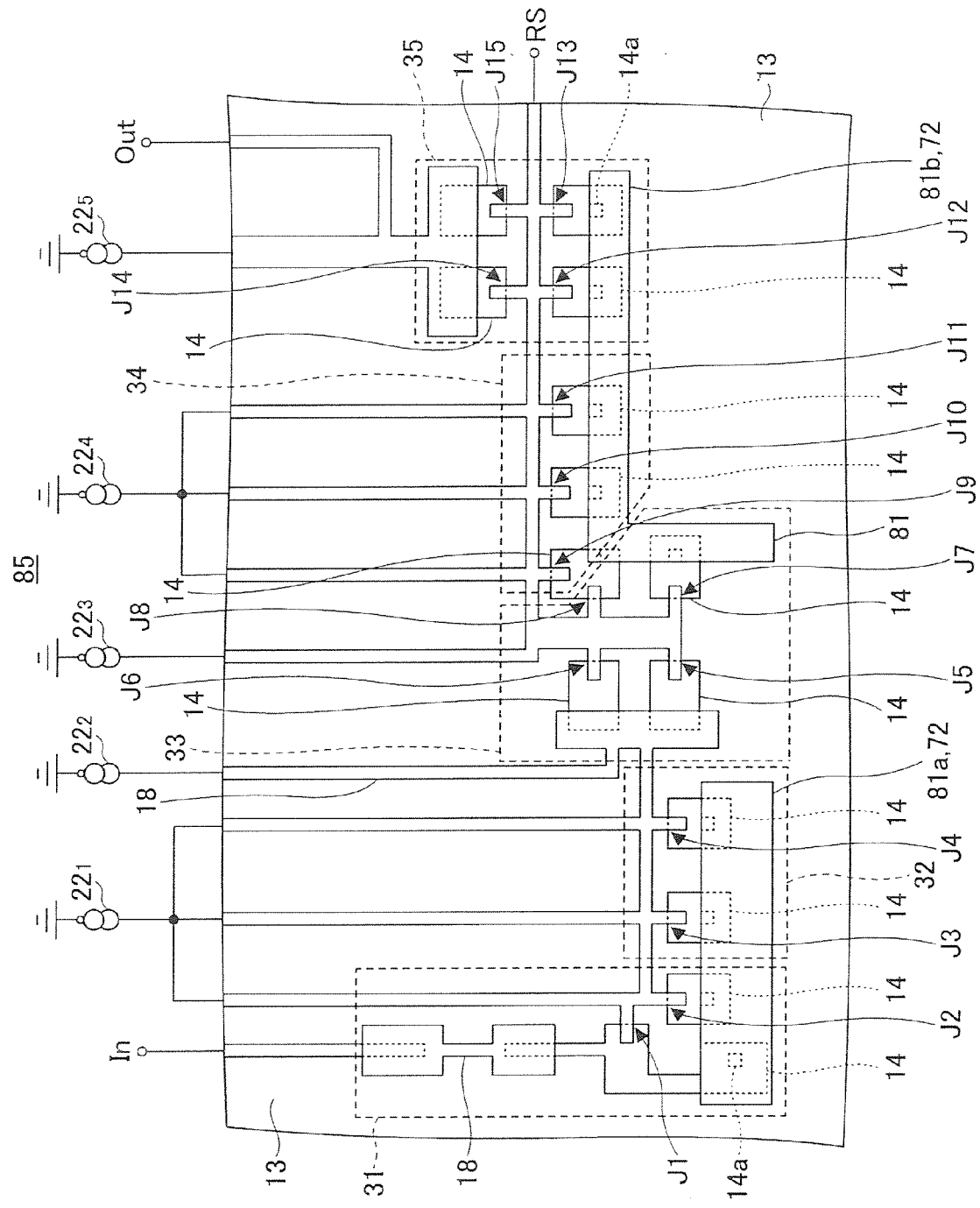
FIG. 25 is a plan view showing a modification of the fourth embodiment of the superconducting junction circuit according to the present invention.

FIG. 25 is a plan view showing a modification of this fourth embodiment of the superconducting junction circuit according to the present invention. In FIG. 25, those parts that are the same as those corresponding parts in FIG. 24 are designated by the same reference numerals, and a description thereof will be omitted.

As shown in FIG. 25, a superconducting junction circuit 85 of this modification of the fourth embodiment has two lower electrode connecting layers 81a and 81b that are separated. Otherwise, the structure of the superconducting junction circuit 85 is the same as that of the superconducting junction circuit 80 of the fourth embodiment shown in FIG. 24. By providing the two lower electrode connecting layers 81a and 81b that are separate, it is possible to increase the redundancy of the circuit patterns and facilitate the circuit design.

Fifth Embodiment

A fifth embodiment of the superconducting junction circuit according to the present invention is an application of the superconducting junction circuit 10 of the first embodiment described above.

Figure 26:
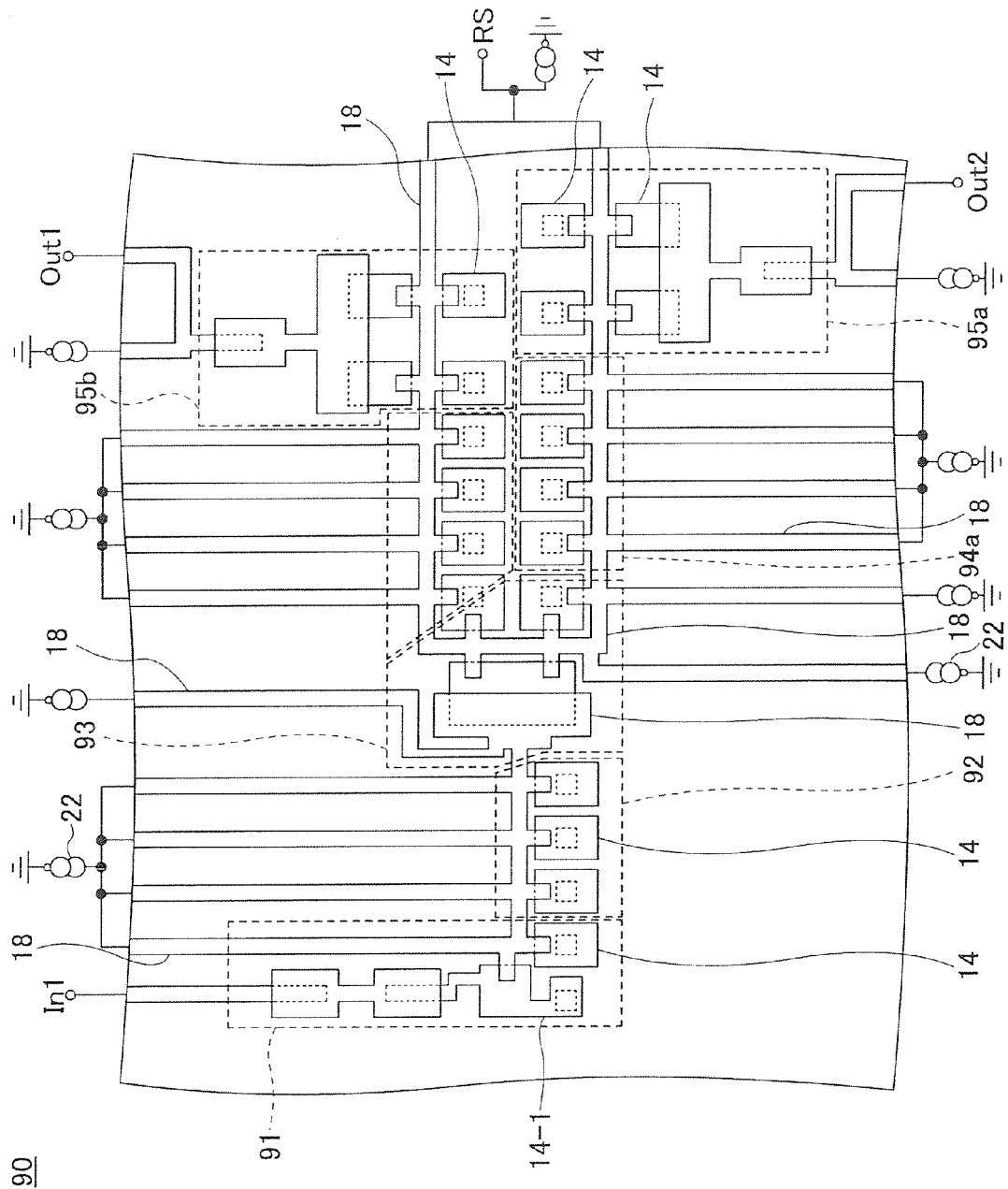
FIG. 26 is a plan view showing a fifth embodiment of the superconducting junction circuit according to the present invention.
Figure 27:
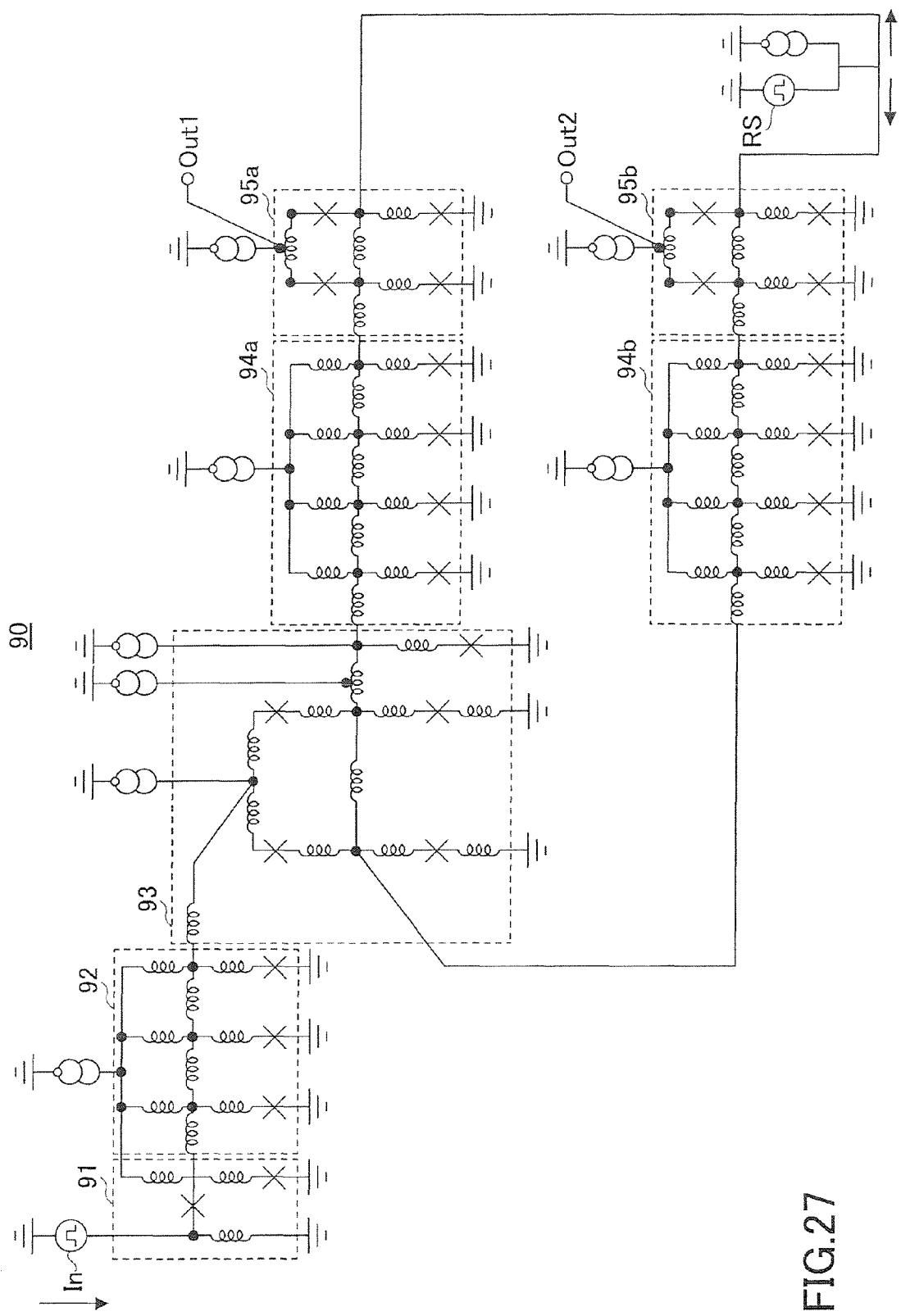
FIG. 27 is an equivalent circuit diagram of the superconducting junction circuit shown in FIG. 26.

FIG. 26 is a plan view showing this fifth embodiment of the superconducting junction circuit according to the present invention, and FIG. 27 is an equivalent circuit diagram of the superconducting junction circuit shown in FIG. 26. In FIGS. 26 and 27, the same reference numerals are used as in the preceding figures with respect to the parts that are the same as the preceding figures.

A superconducting junction circuit 90 of this fifth embodiment shown in FIGS. 26 and 27 has a toggle flip-flop circuit 93 having two output parts Out1 and Out2. More particularly, the superconducting junction circuit 90 has an input end conversion circuit 91 for converting an electrical signal into a flux quantum signal, an input end superconducting transmission line 92 for propagation of the flux quantum, the toggle flip-flop circuit 93, output end superconducting transmission lines 94a and 94b for propagation of the flux quantum, and output end conversion circuits 95a and 95b for converting the flux quantum signal into the electrical signal. Pulse-shaped output signals are alternately output from the two output parts Out1 and Out2 depending on the current pulse that is supplied to an input part In of the superconducting junction circuit 90. Since the basic structure of the superconducting junction circuit 90 is similar to that of the superconducting junction circuit 30 of the second embodiment shown in FIG. 14, a detailed description on the structure and operation of the superconducting junction circuit 90 will be omitted.

Each of the width and the depth of the lower electrode 14 is approximately the same for each of the superconducting junctions, except for a lower electrode 14-1 that is provided at the side of the input part In of the input end conversion circuit 91. Accordingly, as described above in conjunction with the first embodiment, the critical current density is approximately the same for each of the superconducting junctions of the superconducting junction circuit 90. As a result, by setting a predetermined junction width with respect to each of the superconducting junctions, it is possible to set the critical current to a value that is required for a stable circuit operation of the superconducting junction circuit 90, and to suppress the inconsistency of the critical current.

Sixth Embodiment

Figure 28:
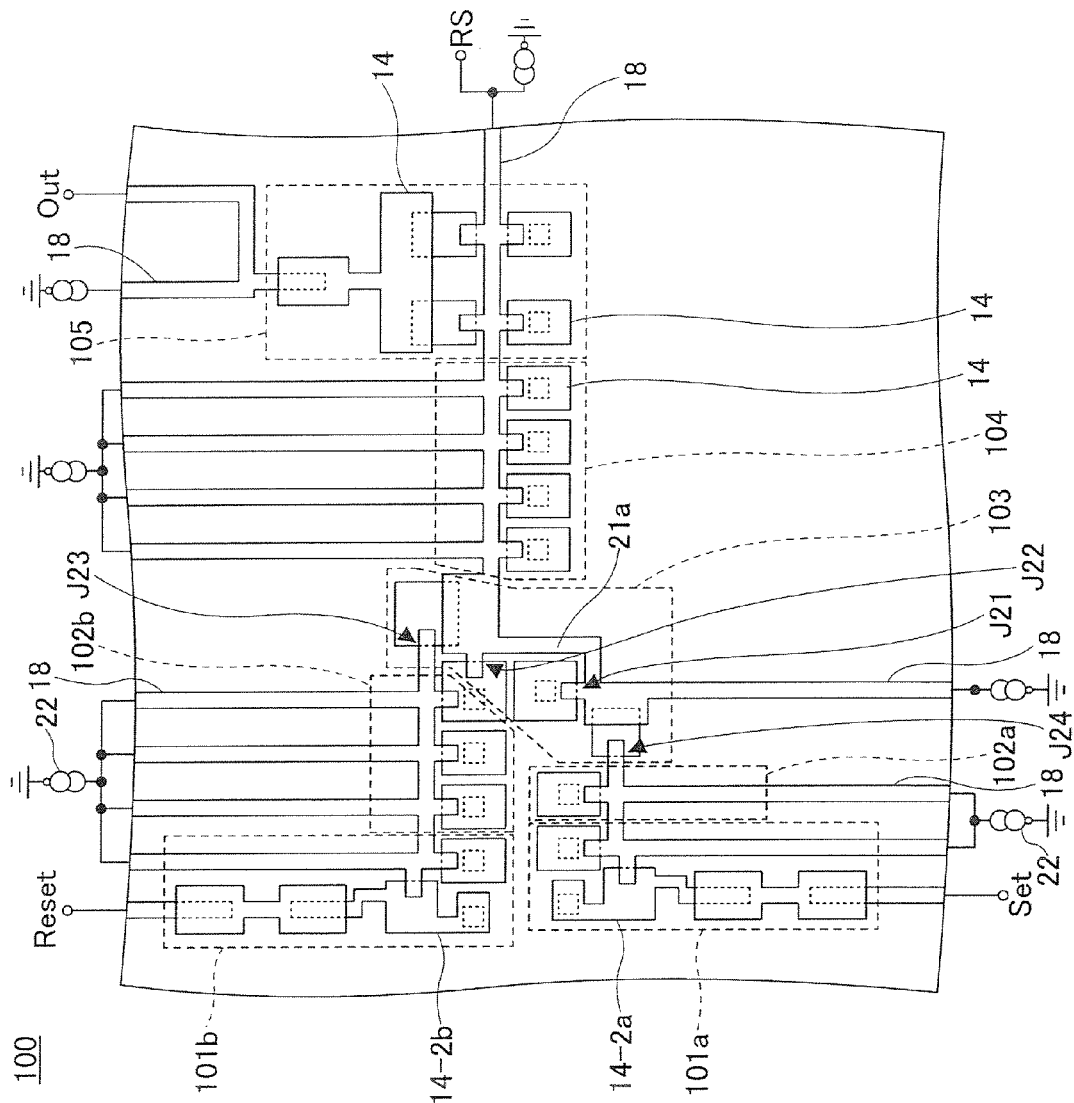
FIG. 28 is a plan view showing a sixth embodiment of the superconducting junction circuit according to the present invention.
Figure 29:
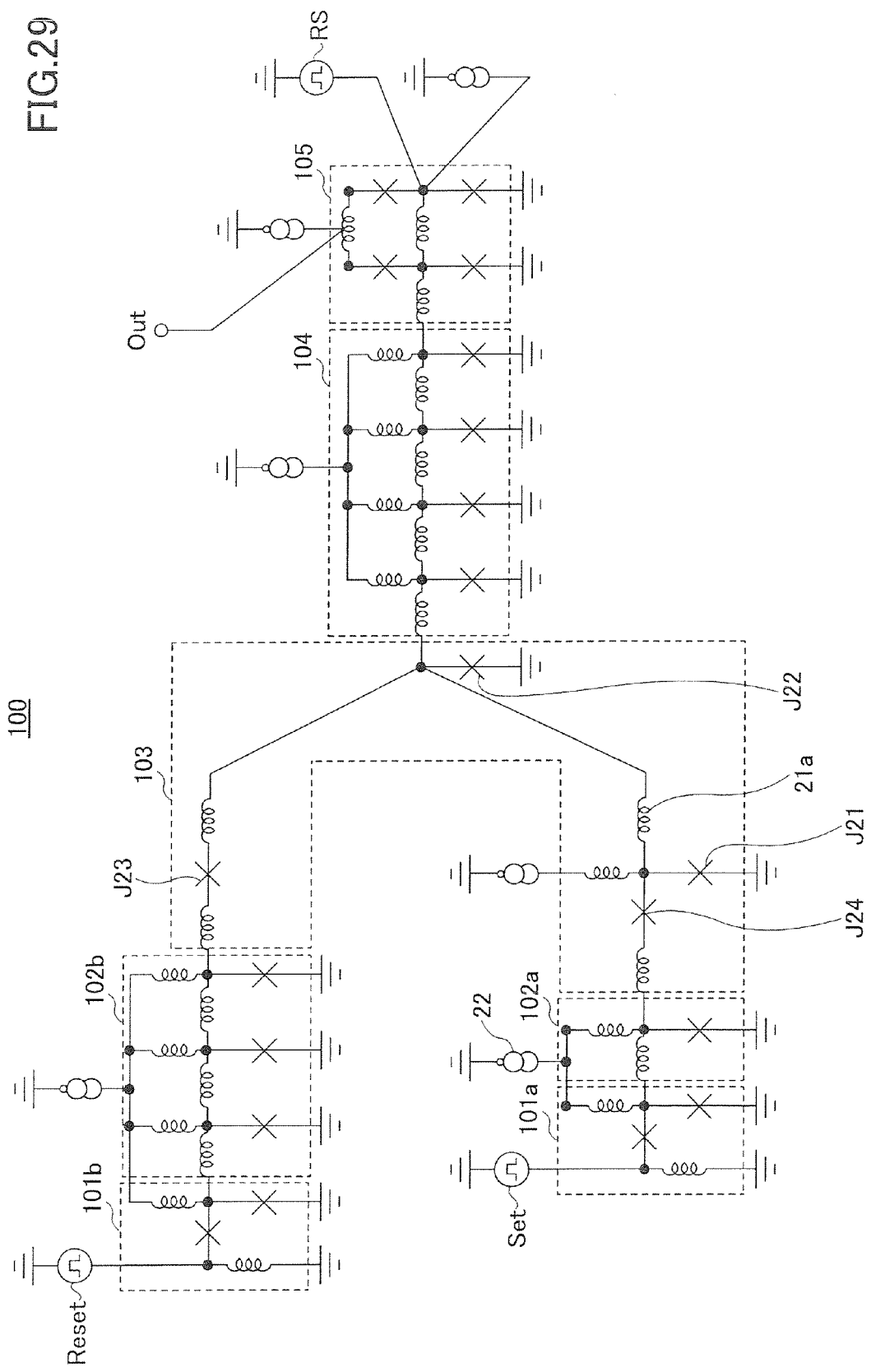
FIG. 29 is an equivalent circuit diagram of the superconducting junction circuit shown in FIG. 28.

FIG. 28 is a plan view showing a sixth embodiment of the superconducting junction circuit according to the present invention, and FIG. 29 is an equivalent circuit diagram of the superconducting junction circuit shown in FIG. 28. In FIGS. 28 and 29, the same reference numerals are used as in the preceding figures with respect to the parts that are the same as the preceding figures.

A superconducting junction circuit 100 of this sixth embodiment shown in FIGS. 28 and 29 has a set-reset flip-flop circuit 103. More particularly, the superconducting junction circuit 100 has input end conversion circuits 101a and 101b for converting an electrical signal into a flux quantum signal, input end superconducting transmission lines 102a and 102b for propagation of the flux quantum, the set-reset flip-flop circuit 103, an output end superconducting transmission line 104 for propagation of the flux quantum, and an output end conversion circuit 105 for converting the flux quantum signal into the electrical signal.

A description will be given of an operation of the superconducting junction circuit 100. When a current pulse is input from an input part Set to the input end conversion circuit 101a, the current pulse is converted into the flux quantum by the input end conversion circuit 101a and the flux quantum propagates through the input end superconducting transmission line 102a. Hence, the switching of a superconducting junction J21 of the set-reset flip-flop circuit 103 occurs. Consequently, the flux quantum is held in the loop that is formed by the superconducting junction J21, an inductor 21a, a superconducting junction J22 and the ground.

In this state, when a current pulse is input from an input part Reset to the input end conversion circuit 101b, the switching of the superconducting junction J22 occurs, and the held flux quantum is output via the output end superconducting transmission line 104 and the output end conversion circuit 105. A superconducting junction J23 is provided to prevent the reverse flow of the flux quantum. In addition, when two current pulses are successively supplied from the input part Set to the input end conversion circuit 101a, a superconducting junction J24 prevents the flux quantum caused by the second current pulse from affecting the flux quantum that is held in the loop that is formed by the superconducting junction J21, the inductor 21a, the superconducting junction J22 and the ground.

Each of the width and the depth of the lower electrode 14 is approximately the same for each of the superconducting junctions, except for a lower electrode 14-2a that is provided at the side of the input part Set of the input end conversion circuit 101a and a lower electrode 14-2b that is provided at the side of the input part Reset of the input end conversion circuit 101b. Accordingly, as described above in conjunction with the first embodiment, the critical current density is approximately the same for each of the superconducting junctions of the superconducting junction circuit 100. As a result, by setting a predetermined junction width with respect to each of the superconducting junctions, it is possible to set the critical current to a value that is required for a stable circuit operation of the superconducting junction circuit 100, and to suppress the inconsistency of the critical current.

Seventh Embodiment

Figure 30:
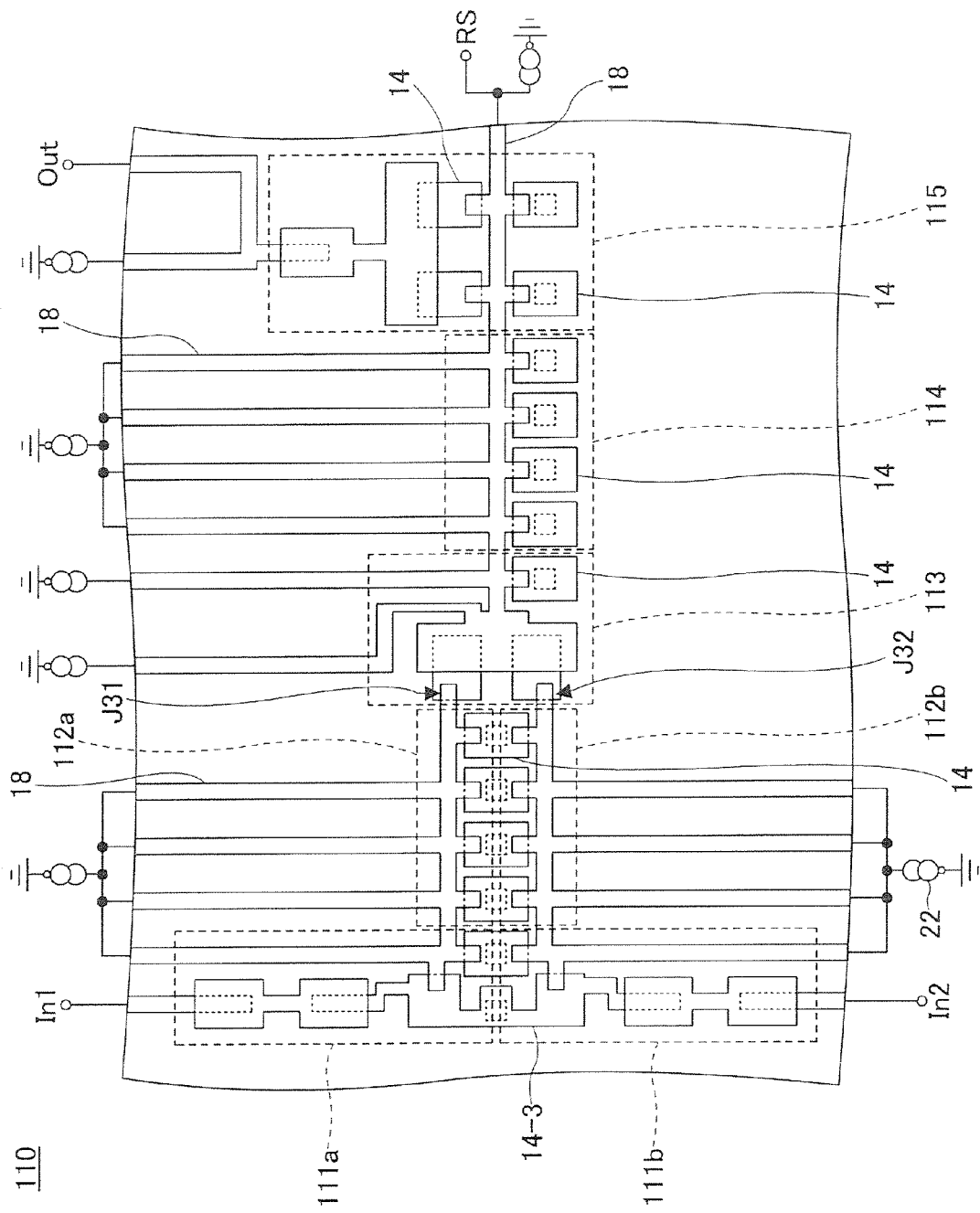
FIG. 30 is a plan view showing a seventh embodiment of the superconducting junction circuit according to the present invention.
Figure 31:
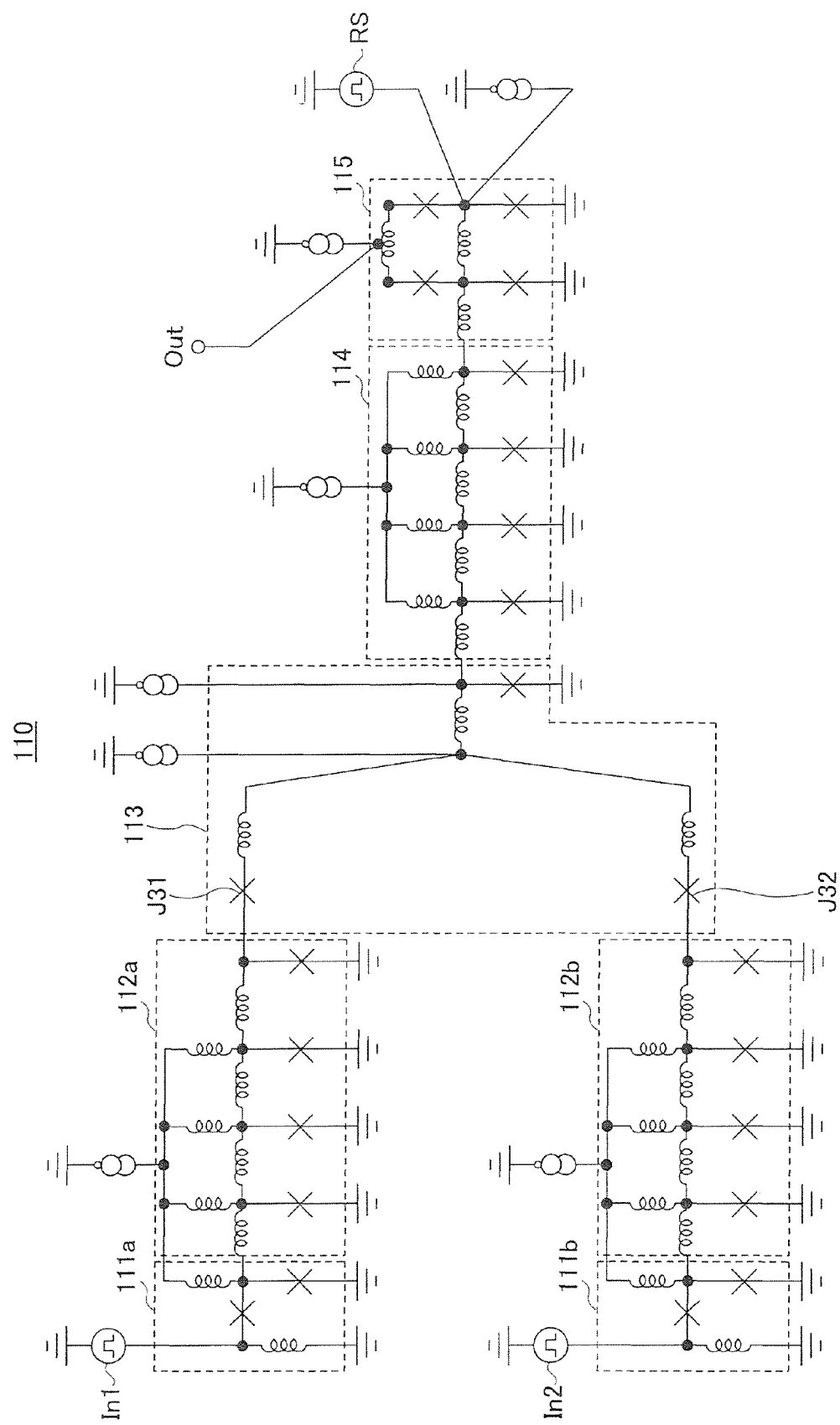
FIG. 31 is an equivalent circuit diagram of the superconducting junction circuit shown in FIG. 30.

FIG. 30 is a plan view showing a seventh embodiment of the superconducting junction circuit according to the present invention, and FIG. 31 is an equivalent circuit diagram of the superconducting junction circuit shown in FIG. 30. In FIGS. 30 and 31, the same reference numerals are used as in the preceding figures with respect to the parts that are the same as the preceding figures.

A superconducting junction circuit 110 of this seventh embodiment shown in FIGS. 30 and 31 has a confluence buffer circuit 113. More particularly, the superconducting junction circuit 110 has input end conversion circuits 111a and 111b for converting an electrical signal into a flux quantum signal, input end superconducting transmission lines 112a and 112b for propagation of the flux quantum, the confluence buffer circuit 113, an output end superconducting transmission line 114 for propagation of the flux quantum, and an output end conversion circuit 115 for converting the flux quantum signal into the electrical signal.

A description will be given of an operation of the superconducting junction circuit 110. When a current pulse is input from an input part In1 to the input end conversion circuit 111a or, a current pulse is input from an input part In2 to the input end conversion circuit 111b, the current pulse is converted into the flux quantum by the input end conversion circuit 111a or 111b and the flux quantum propagates through the input end superconducting transmission line 112a or 112b. Hence, the switching of a superconducting junction J31 or J32 of the confluence buffer circuit 113 occurs. The flux quantum is output from an output part Out via the output end superconducting transmission line 114. The confluence buffer circuit 113 is provided to prevent the reverse flow of the flux quantum towards the input part In1 or In2. When current pulses are simultaneously input from the input parts In1 and In2, only one flux quantum propagates to the output part Out.

Each of the width and the depth of the lower electrode 14 is approximately the same for each of the superconducting junctions, except for a lower electrode 14-3 that is provided at the side of the input parts In1 and In2 of the input end conversion circuits 111a and 111b. Accordingly, as described above in conjunction with the first embodiment, the critical current density is approximately the same for each of the superconducting junctions of the superconducting junction circuit 110. As a result, by setting a predetermined junction width with respect to each of the superconducting junctions, it is possible to set the critical current to a value that is required for a stable circuit operation of the superconducting junction circuit 110, and to suppress the inconsistency of the critical current.

Eighth Embodiment

Figure 32:
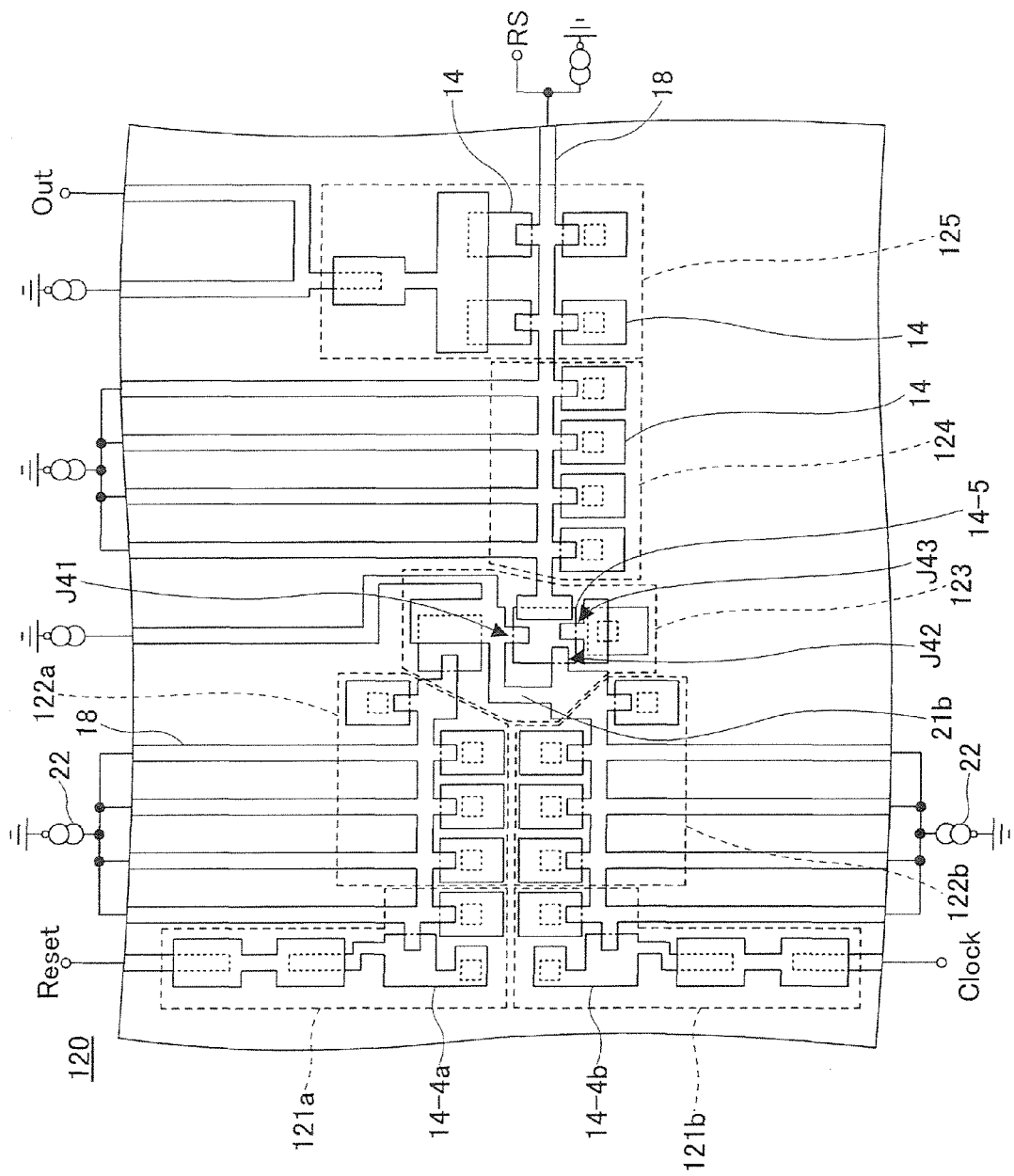
FIG. 32 is a plan view showing an eighth embodiment of the superconducting junction circuit according to the present invention.

FIG. 32 is a plan view showing an eighth embodiment of the superconducting junction circuit according to the present invention, and FIG. 33 is an equivalent circuit diagram of the superconducting junction circuit shown in FIG. 32. In FIGS. 32 and 33, the same reference numerals are used as in the preceding figures with respect to the parts that are the same as the preceding figures.

A superconducting junction circuit 120 of this eighth embodiment shown in FIGS. 32 and 33 has an inverter circuit 123. More particularly, the superconducting junction circuit 120 has input end conversion circuits 121a and 121b for converting an electrical signal into a flux quantum signal, input end superconducting transmission lines 122a and 122b for propagation of the flux quantum, the inverter circuit 123, an output end superconducting transmission line 124 for propagation of the flux quantum, and an output end conversion circuit 125 for converting the flux quantum signal into the electrical signal.

A description will be given of an operation of the superconducting junction circuit 120. When a current pulse is input from an input part In1 to the input end conversion circuit 121a, the current pulse is converted into the flux quantum by the input end conversion circuit 121a and the flux quantum propagates through the input end superconducting transmission line 112a. Hence, the switching of a superconducting junction J41 of the inverter circuit 123 occurs. The flux quantum that causes the current to flow in a direction of an arrow in FIG. 33 is held in the loop that is formed by the superconducting junction J41, an inductor 21b and a superconducting junction J42. In this state, when a current pulse is input from an input part Clock and the flux quantum is supplied to the inverter circuit 123, the switching of the superconducting junction J42 occurs, and the held flux quantum is cancelled, to thereby reset the loop that is formed by the superconducting junction J41, the inductor 21b and the superconducting junction J42. When the current pulse is input from the input part Clock in a state where no flux quantum is held in this loop, the switching of a superconducting junction J43 occurs, and the flux quantum is output from an output part Out via the output end superconducting transmission line 124.

Each of the width and the depth of the lower electrode 14 is approximately the same for each of the superconducting junctions, except for lower electrodes 14-4a and 14-4b that are provided at the side of the input parts In and Clock of the input end conversion circuits 121a and 121b and a lower electrode 14-5 of the inverter circuit 123. Accordingly, as described above in conjunction with the first embodiment, the critical current density is approximately the same for each of the superconducting junctions of the superconducting junction circuit 120. As a result, by setting a predetermined junction width with respect to each of the superconducting junctions, it is possible to set the critical current to a value that is required for a stable circuit operation of the superconducting junction circuit 120, and to suppress the inconsistency of the critical current.

This application claims the benefit of a Japanese Patent Application No. 2005-306499 filed Oct. 21, 2005, in the Japanese Patent Office, the disclosure of which is hereby incorporated by reference.

Further, the present invention is not limited to these embodiments, but various variations and modifications may be made without departing from the scope of the present invention.

What is claimed is:

1. A superconducting junction circuit, comprising:
 a plurality of lower electrodes formed by a superconductor layer;
 a barrier layer provided on a portion of a surface of each of the plurality of lower electrodes;
 at least one upper electrode formed by a superconductor and covering each barrier layer; and
 a plurality of superconducting junctions each formed by a corresponding lower electrode and barrier layer and the upper electrode,
 wherein the lower electrodes forming the superconducting junctions have a rectangular shape in a plan view,
 wherein each of the at lest one upper electrode and the plurality of lower electrodes is made of an oxide superconductor material,
 wherein a critical current density of each of the plurality of superconducting junctions is controlled based on a width and/or a depth of the corresponding lower electrode and an area of the corresponding lower electrode,
 wherein widths of the lower electrodes of the superconducting junctions have an average value Avg1 and a standard deviation $\sigma1$, and a ratio $\sigma1/Avg1$ is set in a range of 0 to 23%.

2. The superconducting junction circuit as claimed in claim 1, wherein areas of the lower electrodes forming the superconducting junctions are substantially the same.

3. The superconducting junction circuit as claimed in claim 1, wherein shapes of the lower electrodes forming the superconducting junctions are substantially the same.

4. The superconducting junction circuit as claimed in claim 1, wherein depths of the lower electrodes of the superconducting junctions have an average value Avg2 and a standard deviation $\sigma2$, and a ratio $\sigma2/Avg2$ is set in a range of 0 to 23%.

5. The superconducting junction circuit as claimed in claim 1, further comprising:
 a superconducting magnetic shielding layer that is grounded; and
 an insulator layer provided on the superconducting magnetic shielding layer, wherein the superconducting magnetic shielding layer is electrically connected to the lower electrode via a contact hole provided in the insulator layer.

6. The superconducting junction circuit as claimed in claim 5, wherein the critical current density of each of the superconducting junctions is further controlled based on an area of a corresponding contact hole.

7. The superconducting junction circuit as claimed in claim 5, further comprising:
 a lower electrode connecting layer formed by a superconductor layer and electrically connecting a plurality of lower electrodes.

8. The superconducting junction circuit as claimed in claim 7, wherein the lower electrode connecting layer is provided on the lower electrodes.

9. The superconducting junction circuit as claimed in claim 7, wherein a plurality of said lower electrode connecting layers are provided with respect to the lower electrodes, and the lower electrode connecting layers electrically connect mutually different lower electrodes.

10. The superconducting junction circuit as claimed in claim 7, wherein the lower electrode connecting layer is made of an oxide superconductor material.

11. The superconducting junction circuit as claimed in claim 5, wherein an area of the contact hole is 100 $\mu m^2$ or less and greater than 0.

12. The superconducting junction circuit as claimed in claim 5, wherein the superconducting magnetic shielding layer is made of an oxide superconductor material.

13. A superconducting junction circuit, comprising:
 plurality of lower electrodes formed by a superconductor layer;
 a barrier layer provided on a portion of a surface of each of the plurality of lower electrodes;
 at least one upper electrode formed by a superconductor and covering each barrier layer; and
 a plurality of superconducting junctions each formed by a corresponding lower electrode and barrier layer and the upper electrode,
 wherein the lower electrodes forming the superconducting junctions have a rectangular shape in a plan view,
 wherein each of the at lest one upper electrode and the plurality of lower electrodes is made of an oxide superconductor material,
 wherein a critical current density of each of the plurality of superconducting junctions is controlled based on a width and/or a depth of the corresponding lower electrode and an area of the corresponding lower electrode,
wherein widths of the lower electrodes of the superconducting junctions have an average value Avg1 and a standard deviation a1, and a ratio σ1/Avg1 is set in a range of 0 to 23%, and wherein information is carried by a signal of a flux quantum produced by the plurality of superconducting junctions.

* * * * *